United States Patent
Komatsu

(10) Patent No.: US 10,305,392 B2
(45) Date of Patent: May 28, 2019

(54) CONVERSION APPARATUS, EQUIPMENT, AND CONTROL METHOD

(71) Applicant: HONDA MOTOR CO., LTD., Tokyo (JP)

(72) Inventor: Masaaki Komatsu, Saitama (JP)

(73) Assignee: HONDA MOTOR CO., LTD., Tokyo (JP)

( * ) Notice: Subject to any disclaimer, the term of this patent is extended or adjusted under 35 U.S.C. 154(b) by 43 days.

(21) Appl. No.: 15/715,374

(22) Filed: Sep. 26, 2017

(65) Prior Publication Data

US 2018/0097454 A1    Apr. 5, 2018

(30) Foreign Application Priority Data

Oct. 3, 2016   (JP) .................................. 2016-195921

(51) Int. Cl.
H02P 27/08     (2006.01)
H02M 7/49      (2007.01)
(Continued)

(52) U.S. Cl.
CPC .............. *H02M 7/49* (2013.01); *B60L 3/003* (2013.01); *B60L 3/0038* (2013.01); *B60L 7/12* (2013.01);
(Continued)

(58) Field of Classification Search
CPC .. H02M 7/539; H02M 7/5395; H02M 3/1588; H02M 3/1582; H02M 7/49;
(Continued)

(56) References Cited

U.S. PATENT DOCUMENTS 6,795,009 B2    9/2004   Duffy et al.
7,274,579 B2 *  9/2007   Ueda ..................... H02M 5/458
                                                         363/125
(Continued)

FOREIGN PATENT DOCUMENTS

JP         07-221619 A      8/1995
JP         2013-240133 A   11/2013
(Continued)

OTHER PUBLICATIONS

Sep. 4, 2017, JP communication issued for related JP application No. 2016-195921.

*Primary Examiner* — Rina I Duda
(74) *Attorney, Agent, or Firm* — Paratus Law Group, PLLC

(57) ABSTRACT

The conversion apparatus includes a conversion module having a plurality of phases, each having a converter capable of performing voltage conversion of discharging electric power of a power source and a sensor detecting phase current flowing in the converter, and in which the phases are electrically connected in parallel, and a controller which controls each converter with a control signal based on a predetermined duty ratio. The controller includes a first determination unit which determines a basic duty ratio common to all of the plurality of phases, a second determination unit which determines a correction duty ratio for correcting the basic duty ratio at each of the converters, and a generation unit which generates a control signal based on the basic duty ratio and the correction duty ratio. The second determination unit determines the correction duty ratio, and sets an upper or lower limit value of the correction duty ratio.

9 Claims, 20 Drawing Sheets

(51) Int. Cl.
  *B60L 7/12* (2006.01)
  *H02M 3/158* (2006.01)
  *B60L 3/00* (2019.01)
  *B60L 50/51* (2019.01)

(52) U.S. Cl.
  CPC ............ *B60L 50/51* (2019.02); *H02M 3/1584* (2013.01); *B60L 2210/40* (2013.01); *B60L 2240/529* (2013.01); *Y02T 10/7005* (2013.01); *Y02T 10/7241* (2013.01)

(58) Field of Classification Search
  CPC ...... H02M 7/493; H02M 3/315; H02M 7/515; H02P 27/08; H02P 27/06; B60L 11/1803; B60L 11/1881; B60L 2210/10
  USPC ...... 363/65, 71, 95; 318/798, 799, 800, 599, 318/811, 432, 434
  See application file for complete search history.

(56) References Cited

U.S. PATENT DOCUMENTS

| | | | | |
|---|---|---|---|---|
| 7,330,011 | B2* | 2/2008 | Ueda | H02P 27/08 318/807 |
| 8,264,181 | B2* | 9/2012 | Yamakawa | H02M 7/53873 318/432 |
| 8,598,853 | B2 | 12/2013 | Tang et al. | |
| 8,680,798 | B2* | 3/2014 | Ueda | B62D 5/046 318/400.02 |
| 8,963,482 | B2* | 2/2015 | Ang | H02J 7/022 320/103 |
| 2006/0067655 | A1* | 3/2006 | Okuda | H02M 1/14 388/805 |
| 2014/0009855 | A1* | 1/2014 | Yamamoto | H02M 1/32 361/42 |
| 2014/0055114 | A1 | 2/2014 | Tang et al. | |
| 2014/0226380 | A1* | 8/2014 | Kawashima | H02M 7/539 363/97 |
| 2014/0339902 | A1 | 11/2014 | Sepe, Jr. et al. | |
| 2015/0270796 | A1* | 9/2015 | Watanabe | H02P 27/085 318/400.05 |

FOREIGN PATENT DOCUMENTS

| | | |
|---|---|---|
| WO | WO2013/038512 A1 | 3/2013 |
| WO | WO2015/004077 A1 | 1/2015 |

* cited by examiner

CONVERSION APPARATUS, EQUIPMENT, AND CONTROL METHOD

CROSS-REFERENCE TO RELATED APPLICATION

This application claims priority from Japanese Patent Application No. 2016-195921 filed on Oct. 3, 2016, the entire contents of which are incorporated herein by reference.

TECHNICAL FIELD

The present invention relates to a conversion apparatus, an equipment, and a control method.

BACKGROUND ART

Patent literature 1 describes a method and a device for balancing a load distribution of parallel-connected power semiconductor modules in a converter performing a voltage conversion. The time of turning-on and turning-off of a switch of each module is set such that uniform current loads are obtained in all the modules during switching. Specifically, an actual current value of each module is measured as an actual load value, an average value of the measured actual current is set as a desired current value with respect to each module, and a level of a gate signal sent to each switch is increased or decreased based on a difference of the desired current value and the actual current value of each module. The technology described in patent literature 1 is described also in patent literatures 2 to 4.

RELATED ART LITERATURE

Patent Literature

Patent Literature 1: JP-A-H07-221619
Patent Literature 2: U.S. Pat. No. 6,795,009
Patent Literature 3: U.S. Pat. No. 8,598,853
Patent Literature 4: US-A-2014/0055114

SUMMARY OF THE INVENTION

Problem that the Invention is to Solve

In the technology described in patent literature 1, the level of the gate signal is increased or decreased based on the difference of the actual current value of each module and the average value of the actual currents thereof. However, since an unavoidable product error is present in a sensor which detects the actual current value of each module, the error is included in the value of the difference. Particularly, when the actual current value is small, the error is dominant in the value of the difference. For this reason, when the level of the gate signal in which the value of the difference having the dominant error is large becomes 0, the converter configured by the parallel-connected power semiconductor modules cannot stably perform the voltage conversion as a primary function.

An object of the present invention is to provide a conversion apparatus, an equipment, and a control method which can reduce a drift current of a phase current between a plurality of phases while a stability of a voltage conversion as a primary function is not affected even in a case where an unavoidable error is in the sensor.

Means for Solving the Problem

In order to achieve the above object, according to an invention of aspect 1, there is provided a conversion apparatus, including:

a conversion module (for example, a VCU 111 in the embodiment) which has a plurality of phases, each of which has a converter capable of performing a voltage conversion of an electric power discharged from or charged in a power source (for example, a battery 105 in the embodiment) and a sensor (for example, phase current sensor 1151, 1152 in the embodiment) detecting a current value of a phase current flowing in the converter, and in which the plurality of phases are electrically connected in parallel; and a controller (for example, an ECU 413 in the embodiment) which controls each of a plurality of the converters with a control signal generated based on a predetermined duty ratio wherein the controller includes a first determination unit (for example, a basic controller 421 in the embodiment) which determines a basic duty ratio common to all of the plurality of phases, such that the conversion module inputs or outputs a target voltage or a target current, a second determination unit (for example, an equalization controller 425, an upper limit value limiting unit 427 in the embodiment) which determines a correction duty ratio for correcting the basic duty ratio at each of the plurality of converters, and, a generation unit (for example, a control signal generation unit 429 in the embodiment) which generates a control signal based on the basic duty ratio and the correction duty ratio, wherein the second determination unit determines the correction duty ratio based on a difference between a plurality of phase currents flowing in the plurality of converters respectively, and the second determination unit sets an upper limit value or a lower limit value of the correction duty ratio based on an amplitude of total currents flowing in the conversion module or the target current.

According to an invention of aspect 2, in the invention of aspect 1, the second determination unit sets the upper limit value or the lower limit value to 0 in a case where the amplitude of the total currents or the target current is less than a first threshold value.

According to an invention of aspect 3, in the invention of aspect 2, the first threshold value is a minimum value that prevents at least one of the plurality of converters from becoming a stop state due to the basic duty ratio.

According to an invention of aspect 4, in the invention of aspect 2, the second determination unit sets the upper limit value or the lower limit value to a value which is closer to 0 as the amplitude of the total currents or the target current is closer to the first threshold value, in a case where the amplitude of the total currents or the target current is equal to or more than the first threshold value and is less than a second threshold value which is larger than the first threshold value.

According to an invention of aspect 5, in the invention of aspect 4, the second determination unit sets the upper limit value or the lower limit value to a predetermined value in a case where the amplitude of the total currents or the target current is equal to or more than the second threshold value.

According to an invention of aspect 6, there is provided a conversion apparatus, including:

a conversion module (for example, a VCU 111 in the embodiment) which has a plurality of phases, each of which has a converter capable of performing a voltage conversion of an electric power discharged from or charged in a power source (for example, a battery 105 in the embodiment) and a sensor (for example, phase current sensor 1151, 1152 in the embodiment) detecting a current value of a phase current flowing in the converter, and in which the plurality of phases are electrically connected in parallel; and a controller (for example, an ECU 413 in the embodiment) which controls each of a plurality of the converters with a control signal generated based on a predetermined duty ratio, wherein the controller includes a first determination unit (for example, a basic controller 421 in the embodiment) which determines a basic duty ratio common to all of the plurality of phases, such that the conversion module inputs or outputs a target voltage or a target current, a second determination unit (for example, an equalization controller 425, an upper limit value limiting unit 427 in the embodiment) which determines the respective correction duty ratios with respect to the plurality of converters based on a difference between a plurality of phase currents flowing in the plurality of converters respectively, and a generation unit (for example, the control signal generation unit 429 in the embodiment) which generates the control signal based only on the basic duty ratio, in a case where at least one of the plurality of converters becomes in a discontinuous mode when the conversion module is controlled with the control signal based on the basic duty ratio and the correction duty ratio.

According to an invention of aspect 7, there is provided an equipment including the conversion apparatus according to the invention of aspect 1.

According to an invention of aspect 8, there is provided a control method of a conversion apparatus including a conversion module (for example, a VCU 111 in the embodiment) which has a plurality of phases, each of which has a converter capable of performing a voltage conversion of an electric power discharged from or charged in a power source (for example, a battery 105 in the embodiment) and a sensor (for example, phase current sensor 1151, 1152 in the embodiment) detecting a current value of a phase current flowing in the converter, and in which the plurality of phases are electrically connected in parallel, and a controller (for example, an ECU 413 in the embodiment) which controls each of a plurality of the converters with a control signal generated based on a predetermined duty ratio, the method includes the steps of:

determining a basic duty ratio common to all of the plurality of phases, such that the conversion module inputs or outputs a target voltage or a target current;

setting an upper limit value or a lower limit value of a correction duty ratio for correcting the basic duty ratio based on an amplitude of total currents flowing in the conversion module or the target current;

determining the correction duty ratio at each of the plurality of converters based on a difference between a plurality of phase currents flowing in the plurality of converser respectively; and generating a control signal based on the basic duty ratio and the correction duty ratio.

According to an invention of aspect 9, there is provided a control method of a conversion apparatus including a conversion module (for example, a VCU 111 in the embodiment) which has a plurality of phases, each of which has a converter capable of performing a voltage conversion of an electric power discharged from or charged in a power source (for example, a battery 105 in the embodiment) and a sensor (for example, phase current sensor 1151, 1152 in the embodiment) detecting a current value of a phase current flowing in the converter, and in which the plurality of phases are electrically connected in parallel, and a controller (for example, an ECU 413 in the embodiment) which controls each of a plurality of the converters with a control signal generated based on a predetermined duty ratio, the method includes the steps of:

determining a basic duty ratio common to all of the plurality of phases, such that the conversion module inputs or outputs a target voltage or a target current;

determining the respective correction duty ratios with respect to the plurality of converters based on a difference between a plurality of phase currents flowing in the plurality of converters respectively; and generating the control signal based only on the basic duty ratio in a case where at least one of the plurality of converters becomes in a discontinuous mode when the conversion module is controlled with the control signal based on the basic duty ratio and the correction duty ratio.

Advantage of the Invention

According to the invention of aspects 1, 6, and 8, the control signal for controlling each of the plurality of converters of the conversion module which has a sensor having the detection value with an error is set based on the basic duty ratio and the correction duty ratio. The upper limit value or the lower limit value of the correction duty ratio for the balance of the phase currents between the plurality of phases is set based on the amplitude of the total currents flowing in the conversion module or the target current. By setting the upper limit value or the lower limit value, the correction duty ratio is properly suppressed with respect to the amplitude of the total currents flowing in the conversion module or the target current. Thus, no circulating current flows in the conversion module, whereby it is possible to stabilize the control of the conversion module. That is, the correction duty ratio does not affect the stability of the voltage conversion which is a primary function of the conversion module. Thus, it is possible to reduce the drift current of the phase currents between the plurality of phases.

According to the invention of aspect 2, when the amplitude of the total currents flowing in the conversion module or the target current is small, the upper limit value or the lower limit value of the absolute value of the correction duty ratio is set to 0. Thus, it can be prevented that a portion of the plurality of converters becomes in the discontinuous mode due to the correction duty ratio.

According to the invention of aspect 3, although an unavoidable error is present in the sensor, it is prevented that at least one of the converters becomes in the stop state by control of the conversion module based on the basic duty ratio. Thus, it is possible to secure the stability of the voltage conversion in the conversion module.

According to the invention of aspect 4, the upper limit value or the lower limit value of the correction duty ratio is set to a value which is closer to 0 as the amplitude of the total currents flowing in the conversion module or the target current is closer to the first threshold value which is a low current value. Thus, while the control for the balance of the phase currents between the plurality of phases is performed, it can be prevented that a portion of the plurality of converters becomes in the discontinuous mode due to the correction duty ratio.

According to the invention of aspect 5, in a value in which the amplitude of the total currents flowing in the conversion module or the target current is equal to or more than the second threshold value which is sufficiently large, the upper limit value or the lower limit value of the correction duty ratio is set to the predetermined value. Thus, it is possible to reliably perform the control for the balance of the phase currents between the plurality of phases.

According to the invention of aspects 6, 7, and 9, the control signal for controlling each of the plurality of converters of the conversion module which has the sensor having the detection value with the error is generated based on the basic duty ratio and the correction duty ratio in principle. In a case where at least one of the plurality of converters becomes in the discontinuous mode due to the correction duty ratio for the balance of the phase currents between the plurality of phases, the control signal is generated only based on the basic duty ratio. Thus, it is possible to stabilize the control of the conversion module. That is, the correction duty ratio does not affect the stability of the voltage conversion which the primary function of the conversion module.

MODE FOR CARRYING OUT THE INVENTION

Hereinafter, an embodiment of the present invention will be described with reference to the drawings.

First Embodiment

Figure 1:
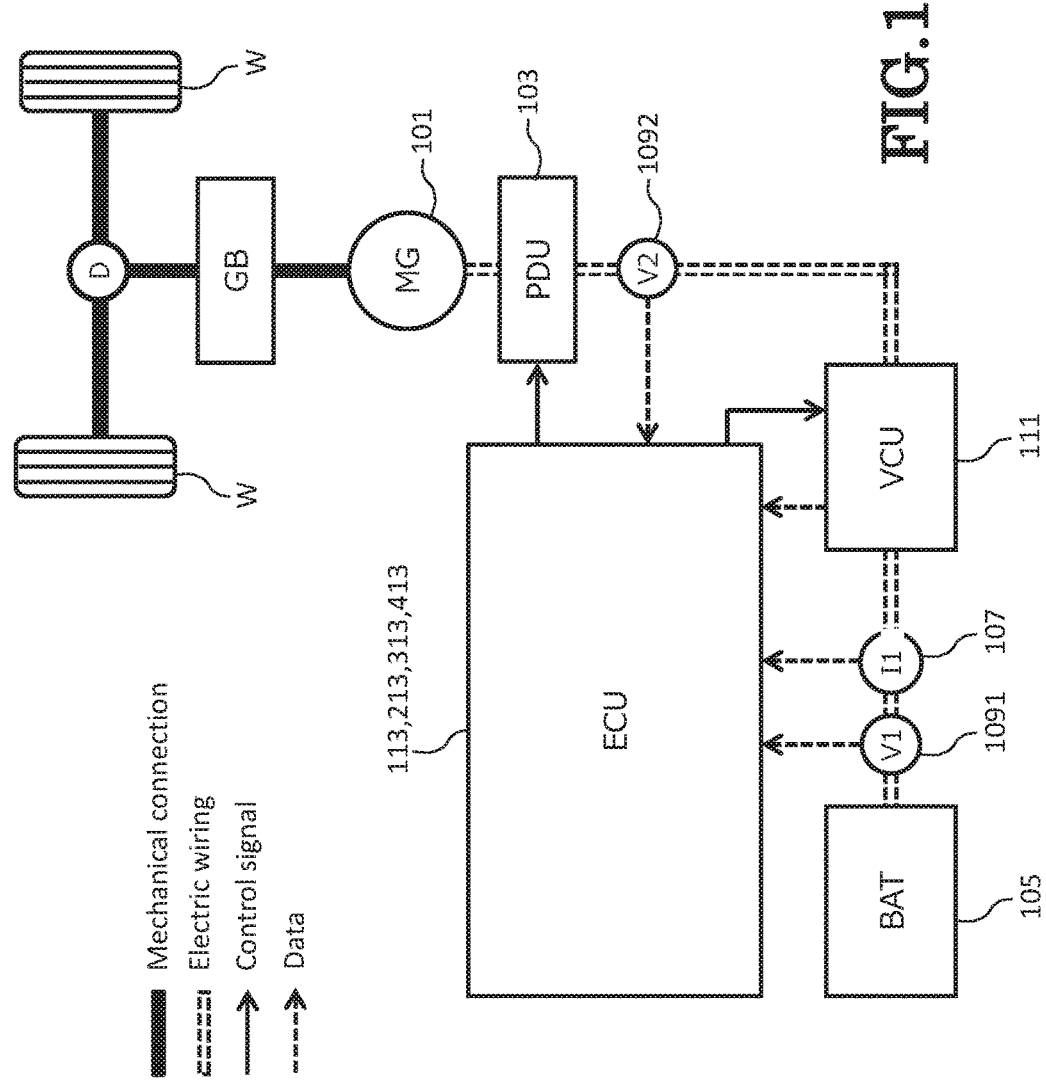
FIG. 1 is a block diagram illustrating a schematic configuration of an electric vehicle in which a conversion apparatus of one embodiment according to the present invention is mounted.

FIG. 1 is a block diagram illustrating a schematic configuration of an electric vehicle in which a conversion apparatus of one embodiment according to the present invention is mounted. A thin solid line in FIG. 1 indicates a mechanical connection, a double dotted line indicates an electric wiring, an arrow of a thin solid line indicates a control signal, and an arrow of a thin dotted line indicates data such as a detection value. A IMOT-type electric vehicle illustrated in FIG. 1 includes a motor generator (MG) 101, a PDU (Power Drive Unit) 103, a battery (BAT) 105, a current sensor 107, voltage sensors 1091 and 1092, a VCU (Voltage Control Unit) 111, and an ECU (Electronic Control Unit) 113. Incidentally, the current sensor 107 and a phase current sensor (to be described) included in a VCU 111 are so-called hall-type current sensors which do not have an electrical contact (node) with a circuit which is a detection object of current. Each current sensor has a core and a hall element. The hall element which is a magnetoelectric conversion element converts magnetic field, which is proportional to the input current generating in a gap of the core, into voltage.

Hereinafter, the description will be given about components included in the electric vehicle.

The motor generator 101 is driven by electric power supplied from a battery 105 to generate power for driving the electric vehicle. A torque generated in the motor generator 101 is transmitted to a driving wheel W through a gear box GB including a variable stage or a fixed stage and a differential box D. In addition, the motor generator 101 is operated as a generator at the time of the deceleration of the electric vehicle, so as to output a braking force of the electric vehicle. Incidentally, a regenerative electric power which is generated by operating the motor generator 101 as a generator is stored in the battery 105.

The PDU 103 converts a DC voltage into a three-phase AC voltage, so as to apply the voltage to the motor generator 101. In addition, the PDU 103 converts an AC voltage, which is input at the time of the regenerative operation of the motor generator 101, into a DC voltage.

The battery 105 has a plurality of power storage cells such as a lithium ion battery or a nickel hydrogen battery and supplies high-voltage electric power to the motor generator 101 through the VCU 111. Incidentally, the battery 105 is not limited to a secondary battery such as the lithium ion battery or the nickel hydrogen battery. For example, a capacitor or a capacitor in which a storable capacity is small and a large amount of the electric power is chargeable/dischargeable during short time may be used as the battery 105.

The current sensor 107 detects an input current IL which is also the output current of the battery 105, to be sent to the VCU 111. The voltage sensor 1091 detects an input voltage V1, which is also the output voltage of the battery 105, to be the VCU 111. The voltage sensor 1092 detects an output voltage V2 of the VCU 111.

The VCU 111 is a so-called multi-phase converter in which two converters are included which can perform the voltage conversion on the electric power which the battery 105 discharges or the electric power which is charged to the battery 105 and are connected in parallel with each other, and an output node and an input node thereof are communalized. The VCU 111 boosts the output voltage of the battery 105 with the state of direct current maintained. In addition, in the VCU 111, the motor generator 101 generates power at the time of deceleration of the electric vehicle to step down the electric power converted into the direct current. The electric power stepped down by the VCU 111 is charged to the battery 105.

Figure 2:
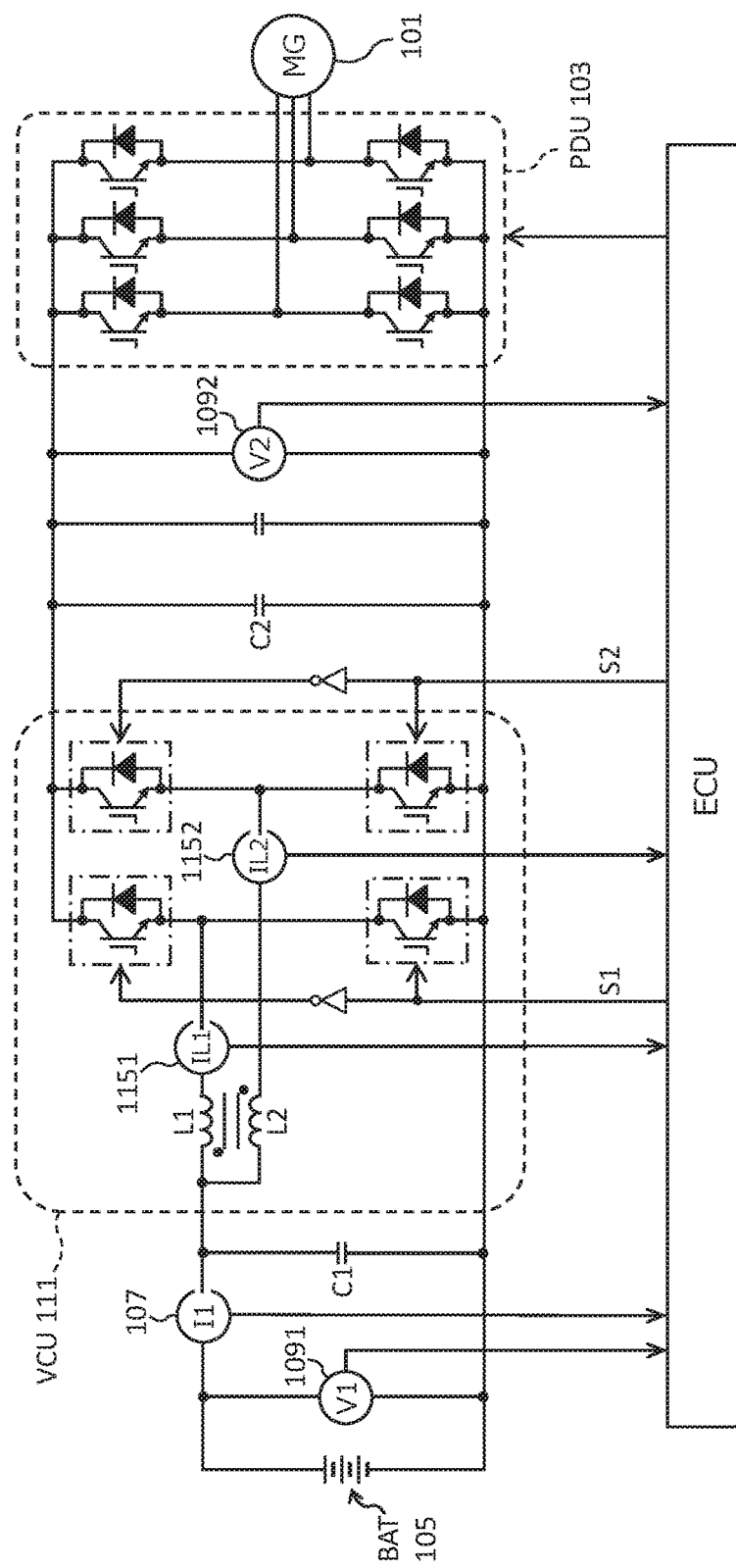
FIG. 2 is an electric circuit diagram illustrating a relation of a battery, a VCU of one embodiment, a PDU, a motor generator, and an ECU.

FIG. 2 is an electric circuit diagram illustrating a relation of the battery 105, the VCU 111, the PDU 103, the motor generator 101, and the ECU 113. As illustrated in FIG. 2, each converter included in the VCU 111 has a reactor. A group of a diode and a switching element connected in parallel is included on each of a high side and a low side of the reactor, so as to configure a boosting chopper circuit. In addition, the VCU 111 has phase current sensors 1151 and 1152 which detect respective current values of the phase currents IL1 and IL2 flowing in two converters. Incidentally, the smoothing capacitor C1 is provided in parallel with two converters on the input side of the VCU 111, and the smoothing capacitor C2 is provided on the output side of the VCU 111.

The two converters included in the VCU 111 are electrically connected in parallel, and each converter performs the voltage conversion in such a manner that the ECU 113 controls and switches the on/off state of the two switching element having a high side and a low side at the desired timing. The on/off-switching operation of the switching element in the converter is controlled with the control signal (PWM (Pulse Width Modulation) signal) which the ECU 113 generates and which has a predetermined duty ratio with a pulse shape. Incidentally, the on/off control on each converter is an interleave control which deviates an on/off-switching phase by 180 degrees with the control signal sent from the ECU 113.

Figure 3:
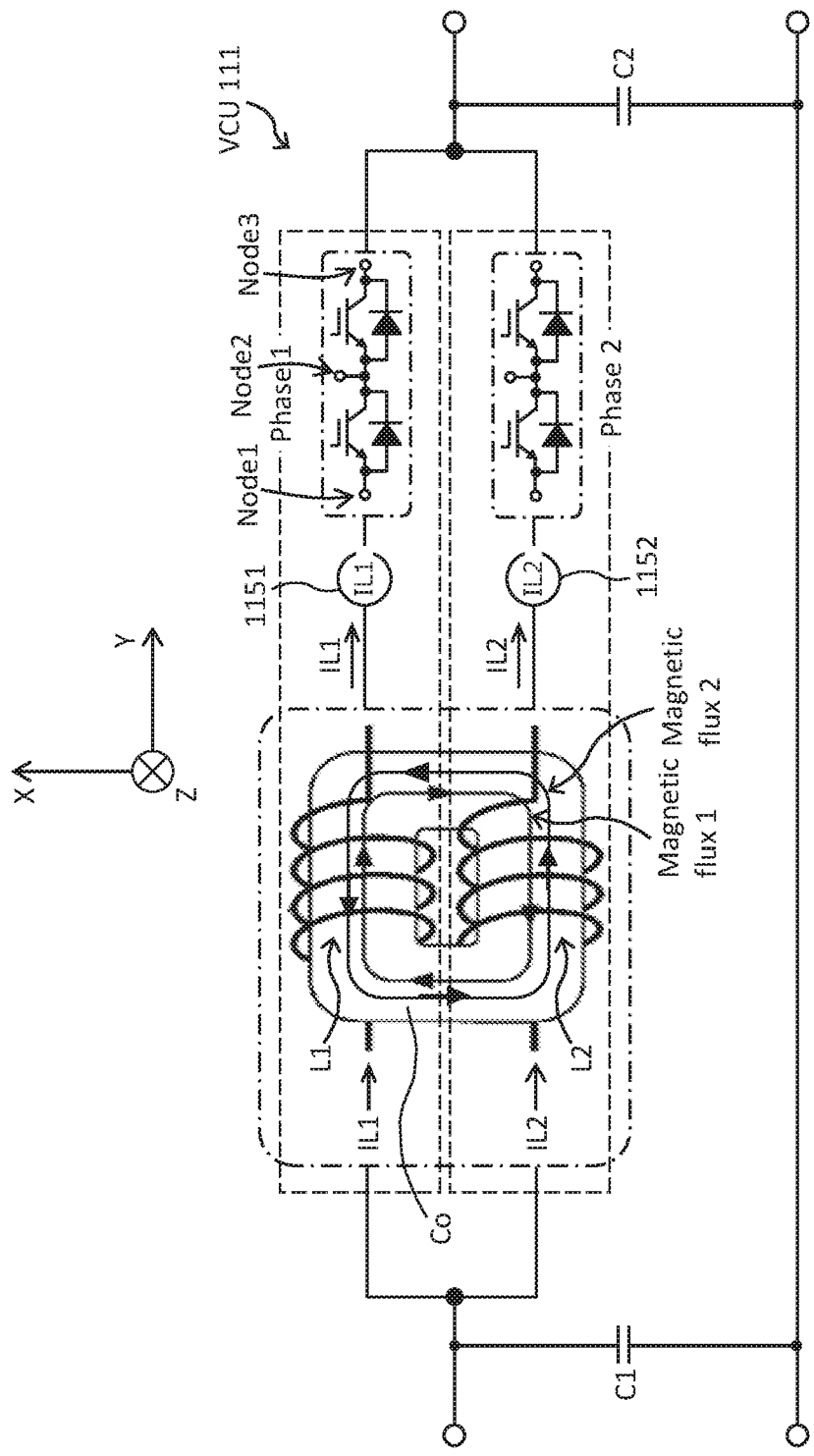
FIG. 3 is a view illustrating a position relation of components of two converters (phase) included in the VCU illustrated in FIG. 2 and a smoothing capacitor when viewed from a Z-axial direction.

FIG. 3 is a view illustrating a position relation of components of two converters included in the VCU 111 illustrated in FIG. 2 and the smoothing capacitors C1 and C2 when viewed from a Z-axial direction. In the following description, a group of the converter and the phase current sensor included in the VCU 111 is described as a "phase". Therefore, in this embodiment, as illustrated in FIG. 3, a group of the converter including a reactor L1 and a phase current sensor 1151 is described as a "phase 1", and a group of the converter including a reactor L2 and a phase current sensor 1152 is described as a "phase 2".

As illustrated in FIG. 3, in this embodiment, the phase 1 and the phase 2 are arranged side by side in a row on a XY plane. In addition, an iron core of the reactor L1 configuring the phase 1 and an iron core of the reactor L2 configuring the phase 2 are shared, and winding directions of coils of the reactors with respect to the iron cores are inverse with each other. For this reason, the reactor L1 and the reactor L2 are magnetically coupled to each other. In addition, an iron core Co shared by the reactor L1 and the reactor L2 is arranged over the phase 1 and the phase 2 on the XY plane. The XY plane may be either a horizontal plane or a vertical plane.

In FIG. 3, a case where the same current flows in the reactors magnetically coupled to each other indicates that magnetic fluxes generated in respective phases are offset. Through electromagnetic induction, a current IL1 flowing in the reactor L1 generates a magnetic flux 1, and a current IL2 flowing in the reactor L2 generates a magnetic flux 2. As described above, the iron core of the reactor L1 and the iron core of the reactor L2 are shared, and thus the magnetic flux 1 and the magnetic flux 2 are reverse to be offset to each other. Therefore, it is possible to suppress the magnetic saturation the reactor L1 and the reactor L2.

The induced currents IL1 and IL2 of the reactors L1 and L2 of respective phases are input to a node Node2 which is connected to a node connecting one end of the switching element on the low side and one end of the switching element on the high side. The node Node1 of the other end of the switching element on the low side is connected to a ground wire. In addition, the output current of each phase is output by the node Node3 of the other end of the switching element on the high side.

Figure 4:
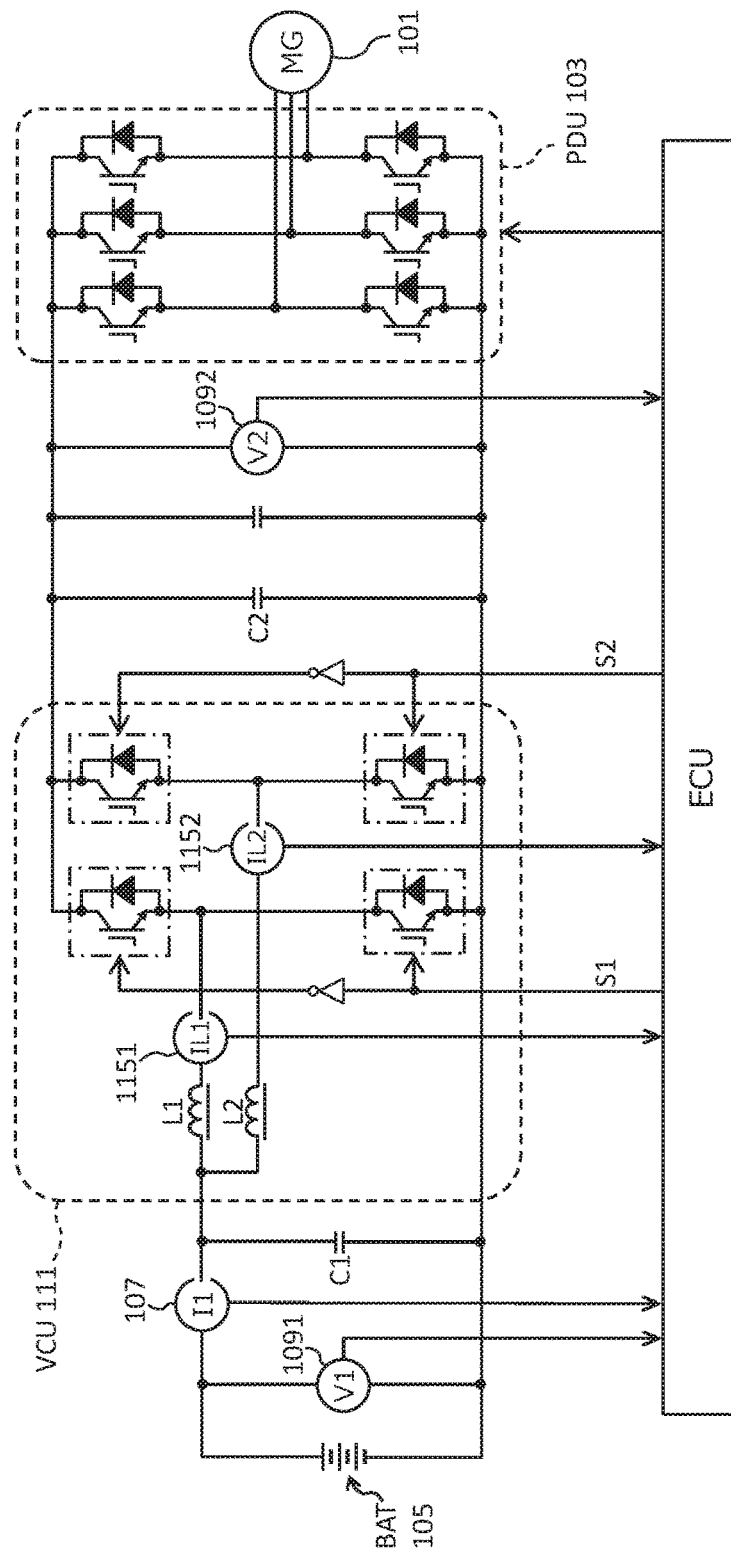
FIG. 4 is an electric circuit diagram illustrating a relation of the battery, a VCU of another embodiment, the PDU, the motor generator, and the ECU.
Figure 5:
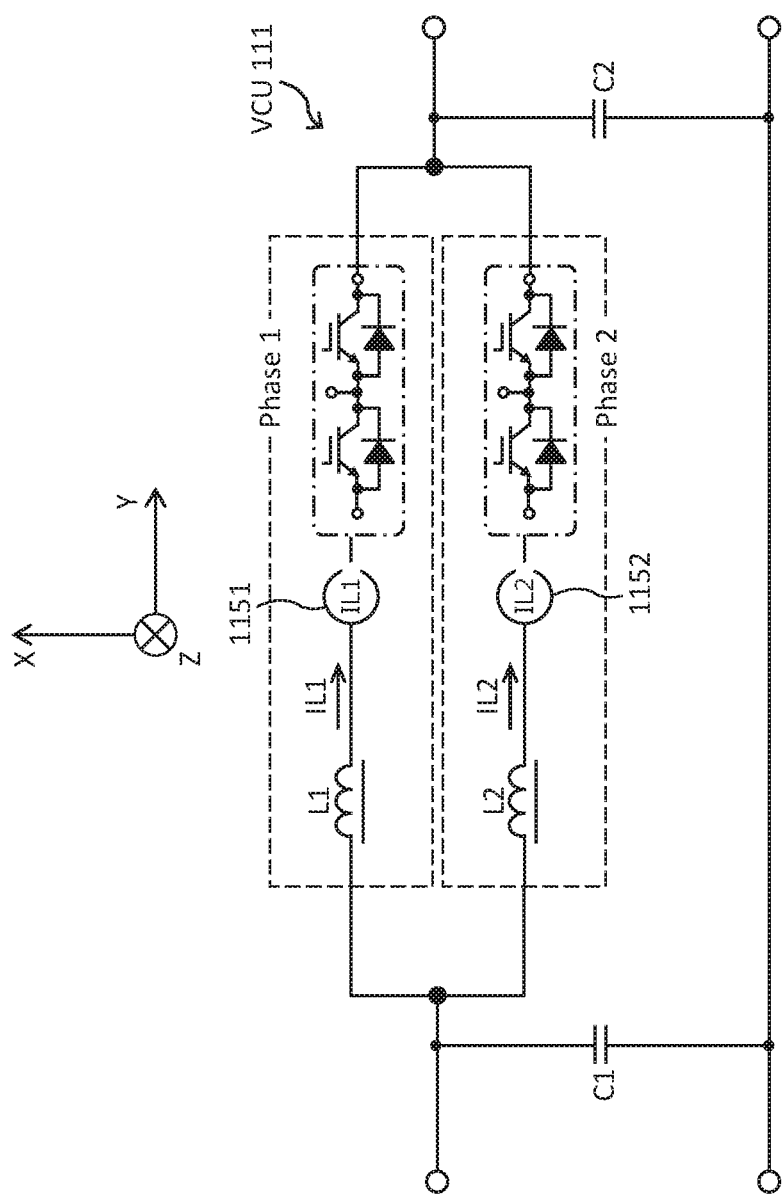
FIG. 5 is a view illustrating a position relation of components of two converters (phase) included in the VCU illustrated in FIG. 4 and a smoothing capacitor when viewed from the Z-axial direction.

Incidentally, as illustrated in FIG. 4, the iron core of each of the reactors configuring the phase 1 and the phase 2 may be configured independently. However, even in the case, as illustrated in FIG. 5, the phase 1 and the phase 2 are arranged side by side in a row on the XY plane.

The ECU 113 performs the on/off control with the control signal supplied to the switching elements of two phases configuring the VCU 111, and the control of the PDU 103. Hereinafter, the control of the VCU 111 by the ECU 113 will be described in detail with reference to FIGS. 6 to 8.

Figure 6:
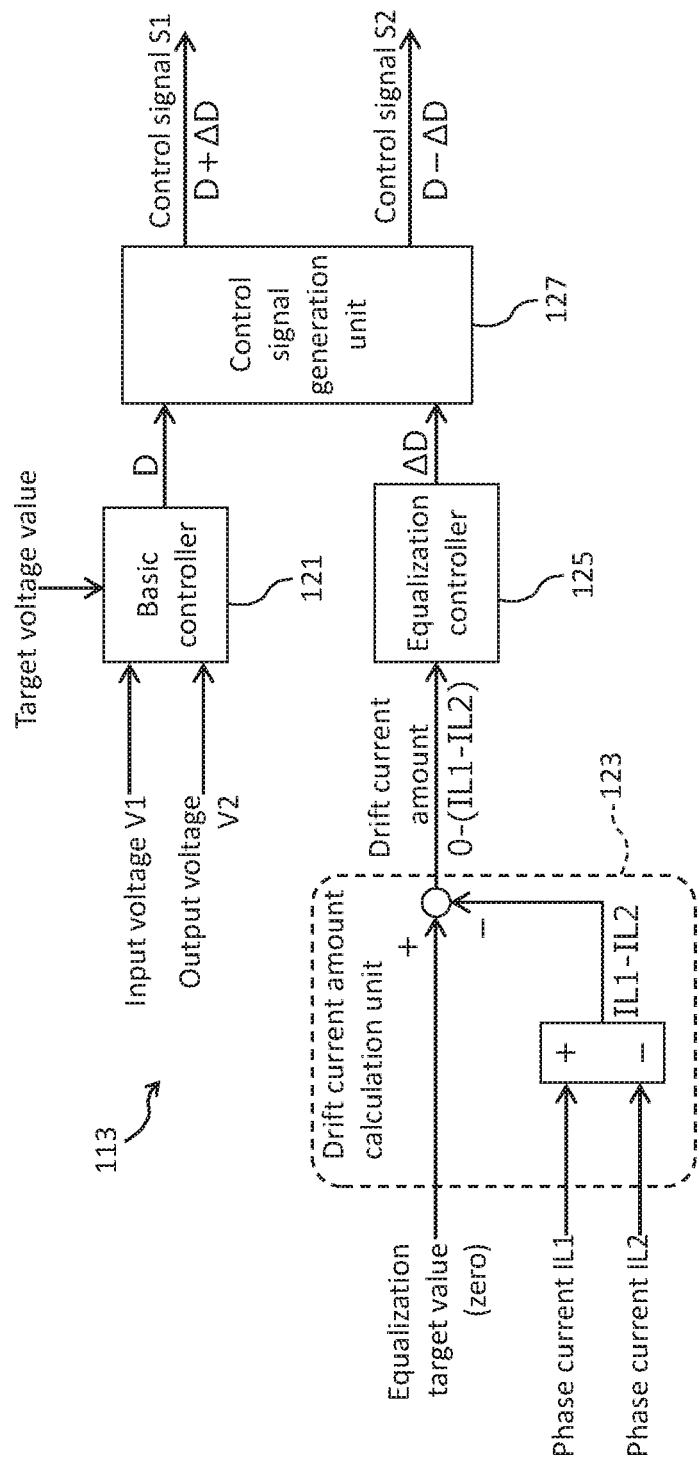
FIG. 6 is a block diagram illustrating an inner structure of an ECU of a first embodiment.

FIG. 6 is a block diagram illustrating the inner structure of the ECU 113 of the first embodiment. As illustrated in FIG. 6, the ECU 113 of the first embodiment includes a basic controller 121, a drift current amount calculation unit 123, an equalization controller 125, and a control signal generation unit 127. Incidentally, the basic controller 121 is a means which takes charge of a control for setting the input or the output of the VCU 111 as the target value. The drift current amount calculation unit 123 and the equalization controller 125 are means which take charge of a control for equalizing the phase currents which flow in the two converters configuring the VCU 111. The control signal generation unit 127 is a means which generates pulse-shaped control signals corresponding to both of two above-described controls for the different objects.

Hereinafter, the description will be given about the components of included in the ECU 113 of the first embodiment.

The basic controller 121 determines a basic duty ratio D of the control signal with respect to the switching elements of the converters configuring the VCU 111 for setting the input voltage V1 or the output voltage V2 as the target voltage value, based on the input voltage V1 of the VCU 111 detected by the voltage sensor 1091, the output voltage V2 of the VCU 111 detected by the voltage sensor 1092, and a target voltage value. Incidentally, the basic controller 121 may determine the basic duty ratio D of the control signal with respect to the switching element of the converters configuring the VCU 111 for setting the input current I1 as the target current value, based on the input current I1 which is sent to the VCU 111 and detected by the current sensor 107 and the target current value.

The drift current amount calculation unit 123 calculates a difference (IL1−IL2) between the phase current IL1 and the phase current IL2 of the phases of the VCU 111 detected by the respective phase current sensors 1151 and 1152. A difference between the corresponding difference and an equalization target value is calculated as a drift current amount. Incidentally, the equalization target value is 0 (zero) [A] as long as there is not a particular reason that balances one phase current. Therefore, the drift current amount calculation unit 123 calculates "IL2−IL1 (=0−(IL1−IL2))" as the drift current amount.

The equalization controller 125 determines a correction duty ratio ΔD to be added or subtracted to the basic duty ratio D of the control signal for equalizing the phase currents IL1 and IL2, based on the drift current amount which the drift current amount calculation unit 123 calculates. That is, the equalization controller 125 separately determines a correction duty ratio "+ΔD" of the positive value and a correction duty ratio "−ΔD" of the negative value which have the same absolute value.

Figure 7:
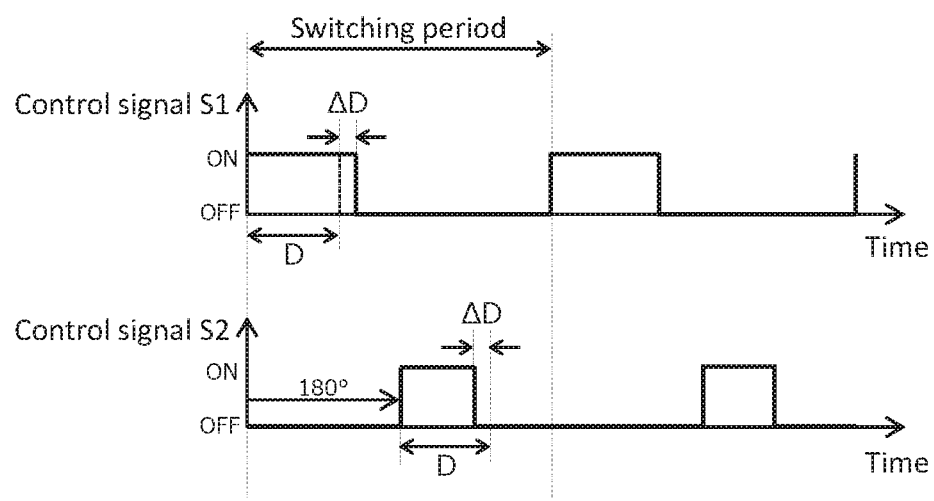
FIG. 7 is a view illustrating one example of time-elapse change of two types of control signals generated by a control signal generation unit.

The control signal generation unit 127 generates two types of control signals S1 and S2 based on the basic duty ratio D determined by the basic controller 121 and the correction duty ratio ΔD determined by the equalization controller 125. FIG. 7 is a view illustrating one example of time-elapse change of the control signals S1 and S2 which the control signal generation unit 127 generates. As illustrated in FIG. 7, the control signal generation unit 127 generates the control signal S1 in which the duty ratio is "D+ΔD" and the control signal S2 in which the duty ratio is "D−ΔD". As illustrated in FIG. 2 or 4, one of two types of control signals S1 and S2 generated by the control signal generation unit 127 is supplied to the switching element of one of the two converters configuring the VCU 111, and the other control signal is supplied to the switching element of the other converter.

Figure 8:
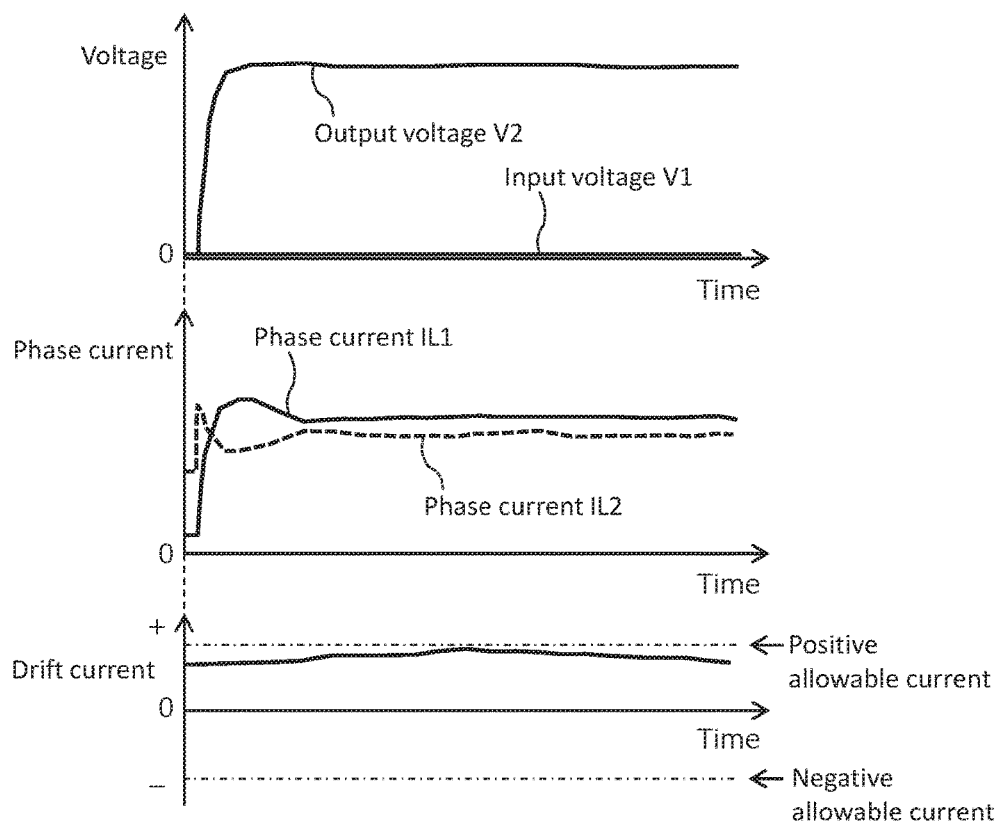
FIG. 8 is a view illustrating one example of time-elapse change of a phase current and a drift current amount of each converter when the VCU boosts an input voltage to an output voltage.

The switching elements of the converters configuring the VCU 111 are on/off-controlled with the above-described control signals S1 and S2. Thus, the VCU 111 performs the voltage conversion in consideration of two controls of the control for setting the input or the output as the target value and the control for equalizing the phase currents IL1 and IL2. As a result, as illustrated in FIG. 8, the drift current amount indicated as a difference between the phase current IL1 and the phase current IL2 flowing in the converters when the VCU 111 boosts the input voltage V1 to the output voltage V2 is suppressed to a predetermined value or less.

As described above, according to this embodiment, the correction duty ratio for the balance of the phase currents between two phases includes the positive value (+ΔD) and the negative value (−ΔD) which have the same absolute value, and the sum of the correction duty ratios of the positive value and the negative value is zero. Thus, when the entire VCU 111 including two phases is set as one unit, the correction duty ratio ΔD of each phase is cancelled effectively. For this reason, the drift current of the phase current between two phases can be reduced in a state where it is suppressed that the correction duty ratio ΔD affects the control based on the basic duty ratio D for the voltage conversion. That is, while the correction duty ratio ΔD does not affect the efficiency of the voltage conversion which is a primary function of the VCU 111, the drift current of the phase current between two phases can be reduced. Incidentally, a sum of the correction duty ratios of the positive value and the negative value is not limited to zero, and the absolute value of the sum may be a predetermined value or less. Even in this case, the correction duty ratios ΔD of the phases is effectively cancelled. Thus, while the correction duty ratio ΔD does not affect the efficiency of the voltage conversion which is the primary function of the VCU 111, the drift current of the phase current between two phases can be reduced.

Second Embodiment

A different point of an electric vehicle of a second embodiment from the electric vehicle of the first embodiment is an inner structure of the ECU, and the other points are the same as those of the first embodiment. For this reason, the description about the same portions or the equivalent portions as the first embodiment other than the ECU is simplified or omitted.

Figure 9:
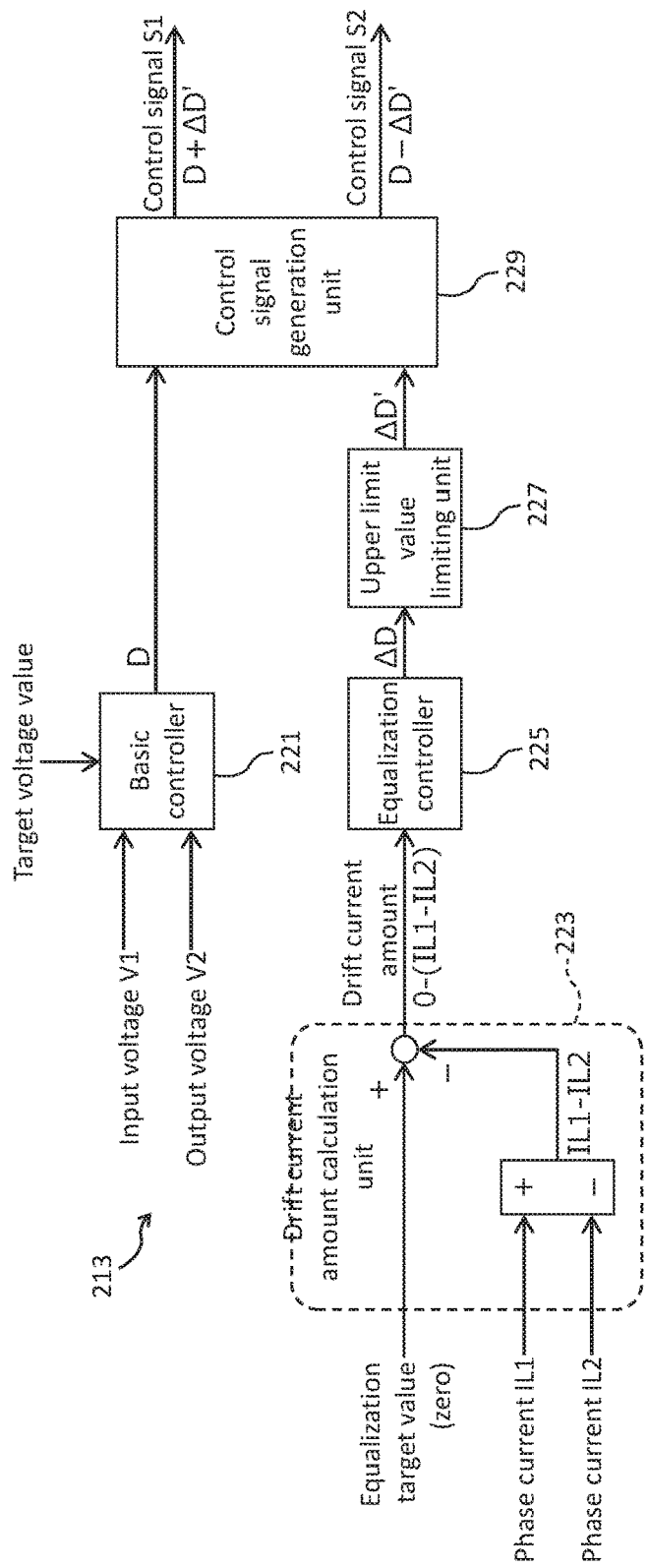
FIG. 9 is a block diagram illustrating an inner structure of an ECU of a second embodiment.

FIG. 9 is a block diagram illustrating an inner structure of an ECU 213 of the second embodiment. In FIG. 9, the common components to those in FIG. 6 of the first embodiment are denoted by the same reference numerals. As illustrated in FIG. 9, the ECU 213 of the second embodiment has a basic controller 221, a drift current amount calculation unit 223, an equalization controller 225, an upper limit value limiting unit 227, and a control signal generation unit 229. Incidentally, the basic controller 221 is a means which takes charge of a control for setting the input or the output of the VCU 111 as the target value. The drift current amount calculation unit 223, the equalization controller 225, and the upper limit value limiting unit 227 are means which take charge of controls for equalizing the phase current flowing in the two converters configuring the VCU 111. The control signal generation unit 229 is a means which generates pulse-shaped control signals corresponding to both of two above-described controls for the different objects.

Hereinafter, the description will be given about the components included in the ECU 213 of the second embodiment.

The basic controller 221 determines the basic duty ratio D of the control signal with respect to the switching elements of the converters configuring the VCU 111 for setting the input voltage V1 or the output voltage V2 as the target voltage value, based on the input voltage V1 of the VCU 111 detected by the voltage sensor 1091, the output voltage V2 of the VCU 111 detected by the voltage sensor 1092, and the target voltage value. Incidentally, the basic controller 221 may determines the basic duty ratio D of the control signal with respect to the switching elements of the converters configuring the VCU 111 for setting the input current I1 as the target current value, based on the input current I1 which is sent to the VCU 111 and detected by the current sensor 107 and the target current value.

The drift current amount calculation unit 223 calculates the difference (IL1−IL2) between the phase current IL1 and the phase current IL2 of the phases of the VCU 111 detected by the respective phase current sensors 1151 and 1152. A difference between the corresponding difference and an equalization target value is calculated as a drift current amount. Incidentally, the equalization target value is 0 (zero) [A] as long as there is not a particular reason that balances one phase current. Therefore, the drift current amount calculation unit 223 calculates "IL2−IL1 (=0−(IL1−IL2))" as the drift current amount.

The equalization controller 225 determines the correction duty ratio ΔD to be added or subtracted to the basic duty ratio D of the control signal for equalizing the phase currents IL1 and IL2, based on the drift current amount which the drift current amount calculation unit 223 calculates. That is, the equalization controller 225 separately determines the correction duty ratio "+ΔD" of the positive value and the correction duty ratio "−ΔD" of the negative value which have the same absolute value.

If the absolute value (|ΔD|) of the correction duty ratio ΔD determined by the equalization controller 225 exceeds an upper limit value ΔDlim preset to a value smaller than the basic duty ratio D, the upper limit value limiting unit 227 outputs a value obtained by performing the upper limit processing on the upper limit value ΔDlim as a correction duty ratio ΔD'. If the absolute value |ΔD| is the upper limit value ΔDlim or less, the upper limit value limiting unit 227 outputs the correction duty ratio ΔD determined by the equalization controller 225 as it is as the correction duty ratio ΔD'.

When the VCU 111 is operated normally, the upper limit value ΔDlim of the absolute value of the correction duty ratio ΔD preset by the upper limit value limiting unit 227 is equal to or more than a maximum value ΔDtha of the correction duty ratio ΔD determined by the equalization controller 225. When at least one of the phase current sensors included in the VCU 111 is abnormal, the upper it value ΔDlim is equal to or less than a minimum value ΔDthb of the correction duty ratio ΔD determined by the equalization controller 225. That is, the upper limit value ΔDlim of the absolute value of the correction duty ratio ΔD is set to a predetermined value within the upper limit value set range illustrated in FIG. 10. Incidentally, the predetermined value is a value which is closer to the maximum value ΔDtha than the minimum value ΔDthb.

The control signal generation unit 229 generates two types of control signals S1 and S2, that is, the control signal S1 in which the duty ratio is "D+ΔD'" and the control signal S2 in which the duty ratio is "D−ΔD'", based on the basic duty ratio D determined by the basic controller 221 and the correction duty ratio ΔD' output by the upper limit value limiting unit 227. As illustrated in FIG. 2 or 4, one of two types of control signals S1 and S2 generated by the control signal generation unit 229 is supplied to the switching element of one of the two converters configuring the VCU 111, and the other control signal is supplied to the switching element of the other converter.

The switching element of the converters configuring the VCU 111 is on/off-controlled with the above-described control signals S1 and S2. Thus, the VCU 111 performs the voltage conversion in consideration of two controls of the control for setting the input or the output as the target value and the control for equalizing the phase currents IL1 and IL2. As a result, the drift current amount indicated as a difference between the phase current IL1 and the phase current IL2 flowing in the converters when the VCU 111 boosts the input voltage V1 to the output voltage V2 is suppressed to the predetermined value or less.

As described above, in this embodiment, although at least one of the phase current sensors included in the VCU 111 is abnormal, the absolute value of the correction duty ratio ΔD' included in the duty ratios of the control signals S1 and S2 generated by the control signal generation unit 229 is equal to or less than the upper limit value which is smaller than the basic duty ratio D. Thus, it can be suppressed that the VCU 111 is controlled based on the excessive correction duty ratio ΔD caused by the error and the like included in the detection value of the broken phase current sensor.

In addition, the upper limit value ΔDlim of the absolute value of the correction duty ratio ΔD preset by the upper limit value limiting unit 227 is equal to or more than the maximum value ΔDtha of the correction duty ratio ΔD determined to reduce the drift current of the phases generated and obtained in a state there all the phase current sensors included in the VCU 111 are normal. For this reason, if all the phase current sensors are normal, the control of the VCU 111 is performed to the maximum in a range where the extreme drift current does not occur between a plurality of phases. In addition, the upper limit value ΔDlim is a value which is equal to or less than the minimum value ΔDthb of the correction duty ratio ΔD determined to reduce the drift current of the phases generated and obtained in a state where a portion of the phase current sensors included in the VCU 111 is abnormal. That is, the minimum value ΔDthb is such a maximum value that prevents that the normal phase current follows the abnormal value to be an excess current in a case where the detection value of the broken phase current sensor indicates the abnormal value. For this reason, even in a case where the detection value of the broken phase current sensor indicates the abnormal value, it is prevented that an excessive control of the VCU 111 is performed due to the correction duty ratio ΔD, and the normal phase current does not reach the excess current.

Figure 11:
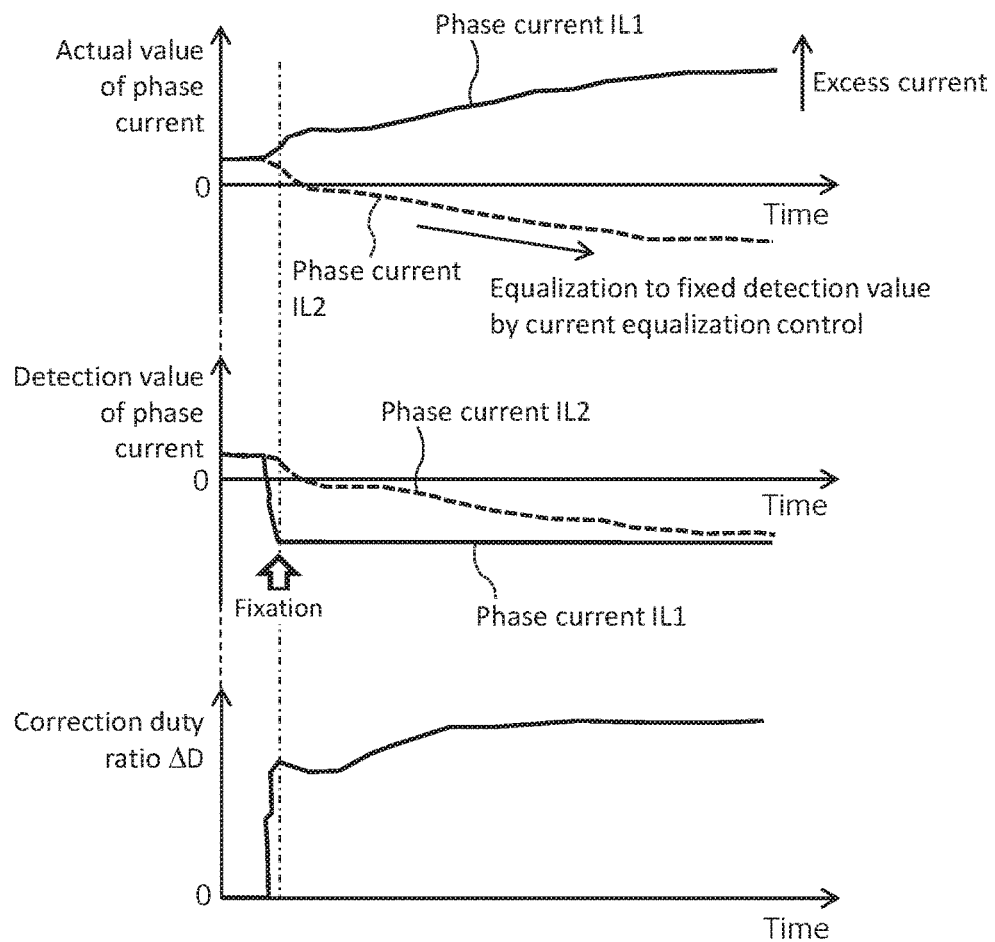
FIG. 11 is a view illustrating time-elapse change in a case where a normal phase current follows an abnormal value which is a detection value of a broken phase current sensor so as to be an excess current.

Incidentally, in a case where a portion of the phase current sensors included in the VCU 111 is abnormal so that the control signal generation unit 229 determines the correction duty ratio ΔD of the value larger than the minimum value ΔDthb, and the converters of the VCU 111 are on/off-controlled with the control signal S1 in which the duty ratio is "D+ΔD" and the control signal S2 in which the duty ratio is "D−ΔD" based on the correction duty ratio ΔD and the basic duty ratio D, the normal phase current follows the abnormal value which is the detection value of the broken phase current sensor to be an excess current as illustrated in FIG. 11.

The upper limit value ΔDlim is a value near the maximum value ΔDtha of the correction duty ratio ΔD determined to reduce the drift current of the phases generated and obtained in a state where all the phase current sensors are normal. Thus, while an countermeasure to the error, which is included in the detection values although all the phase current sensors are normal, is performed in a certain degree, the control of the VCU 111 can be performed to the maximum in a range where the extreme drift current does not occur between a plurality of phases.

Third Embodiment

A different point of an electric vehicle of a third embodiment from the electric vehicle of the first embodiment is an inner structure of the ECU, and the other points are the same as those of the first embodiment. For this reason, the description about the same portions or the equivalent portions as the first embodiment other than the ECU is simplified or omitted.

Figure 12:
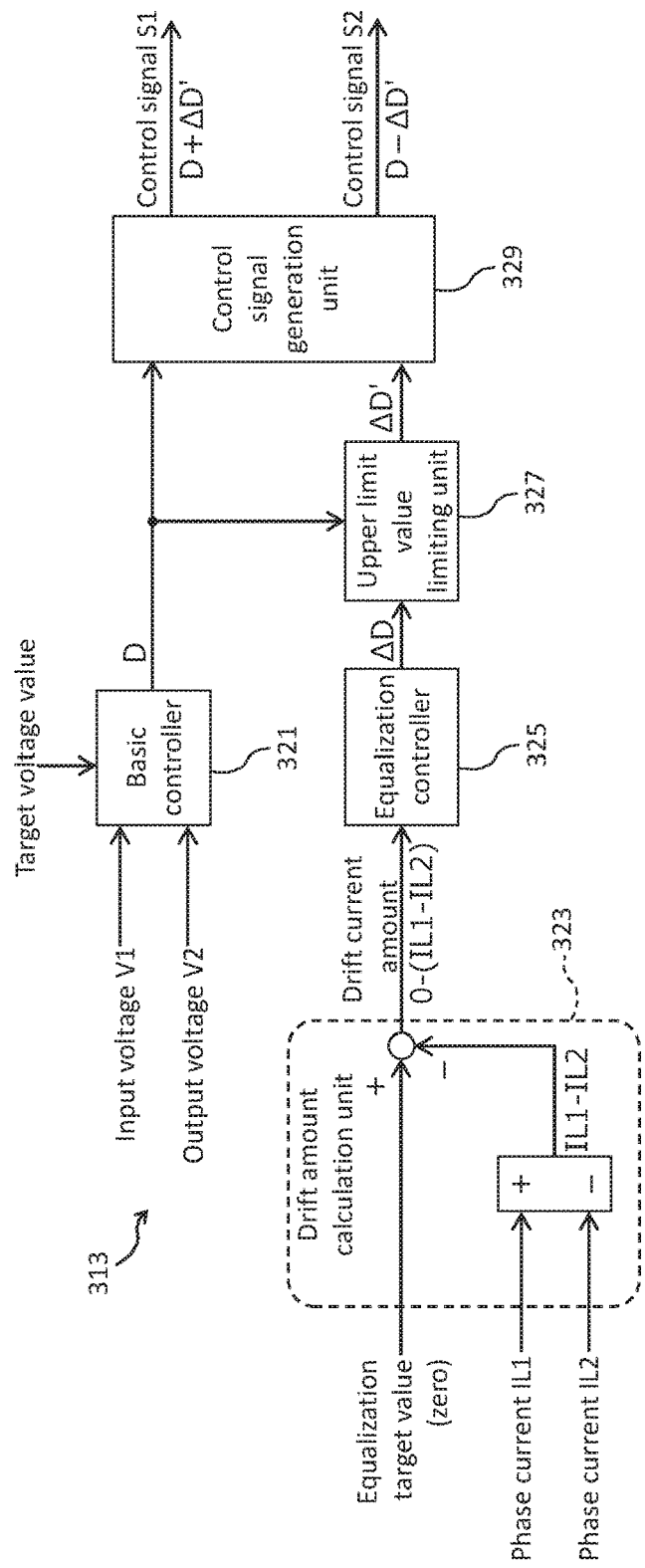
FIG. 12 is a block diagram illustrating an inner structure of an ECU of a third embodiment.

FIG. 12 is a block diagram illustrating an inner structure of an ECU 313 of the third embodiment. In FIG. 12, the common components to those in FIG. 6 of the first embodiment are denoted by the same reference numerals. As illustrated in FIG. 12, the ECU 313 of the third embodiment has a basic controller 321, a drift current amount calculation unit 323, an equalization controller 325, an upper limit value limiting unit 327, and a control signal generation unit 329. Incidentally, the basic controller 321 is a means which take charges of a control for setting the input or the output of the VCU 111 as the target value. The drift current amount calculation unit 323, the equalization controller 325, and the upper limit value limiting unit 327 are means which take charge of controls for equalizing the phase current flowing in the two converters configuring the VCU 111. The control signal generation unit 329 is a means which generates pulse-shaped control signals corresponding to both of two above-described controls for the different objects.

Hereinafter, the description will be given about the components included in the ECU 313 of the third embodiment.

The basic controller 321 determines the basic duty ratio D of the control signal with respect to the switching elements of the converters configuring the VCU 111 for setting the input voltage V1 or the output voltage V2 as the target voltage value, based on the input voltage V1 of the VCU 111 detected by the voltage sensor 1091, the output voltage V2 of the VCU 111 detected by the voltage sensor 1092, and the target voltage value. Incidentally, the basic controller 321 may determines the basic duty ratio D of the control signal with respect to the switching elements of the converters configuring the VCU 111 for setting the input current I1 as the target current value, based on the input current I1 which is sent to the VCU 111 and detected by the current sensor 107 and the target current value.

The drift current amount calculation unit 323 calculates the difference (IL1−IL2) between the phase current IL1 and the phase current IL2 of the phases of the VCU 111 detected by the respective phase current sensors 1151 and 1152. A difference between the corresponding difference and an equalization target value is calculated as a drift current amount. Incidentally, the equalization target value is 0 (zero) [A] as long as there is not a particular reason that balances one phase current. Therefore, the drift current amount calculation unit 323 calculates "IL2−IL1 (=0−(IL1−IL2))" as the drift current amount.

The equalization controller 325 determines the correction duty ratio ΔD to be added or subtracted to the basic duty ratio D of the control signal for equalizing the phase currents IL1 and IL2, based on the drift current amount which the drift current amount calculation unit 323 calculates. That is, the equalization controller 325 separately determines the correction duty ratio "+ΔD" of the positive value and the correction duty ratio "−ΔD" of the negative value which have the same absolute value.

If the absolute value (|ΔD|) of the correction duty ratio ΔD determined by the equalization controller 325 exceeds the upper limit value ΔDlim preset to the value smaller than the basic duty ratio D, the upper limit value limiting unit 327 outputs a value obtained by performing the upper limit processing on the upper limit value ΔDlim as the correction duty ratio ΔD'. If the absolute value |ΔD| is the upper limit value ΔDlim or less, the upper limit value limiting unit 327 outputs the correction duty ratio ΔD determined by the equalization controller 325 as it is as, the correction duty ratio ΔD'.

Figure 13:
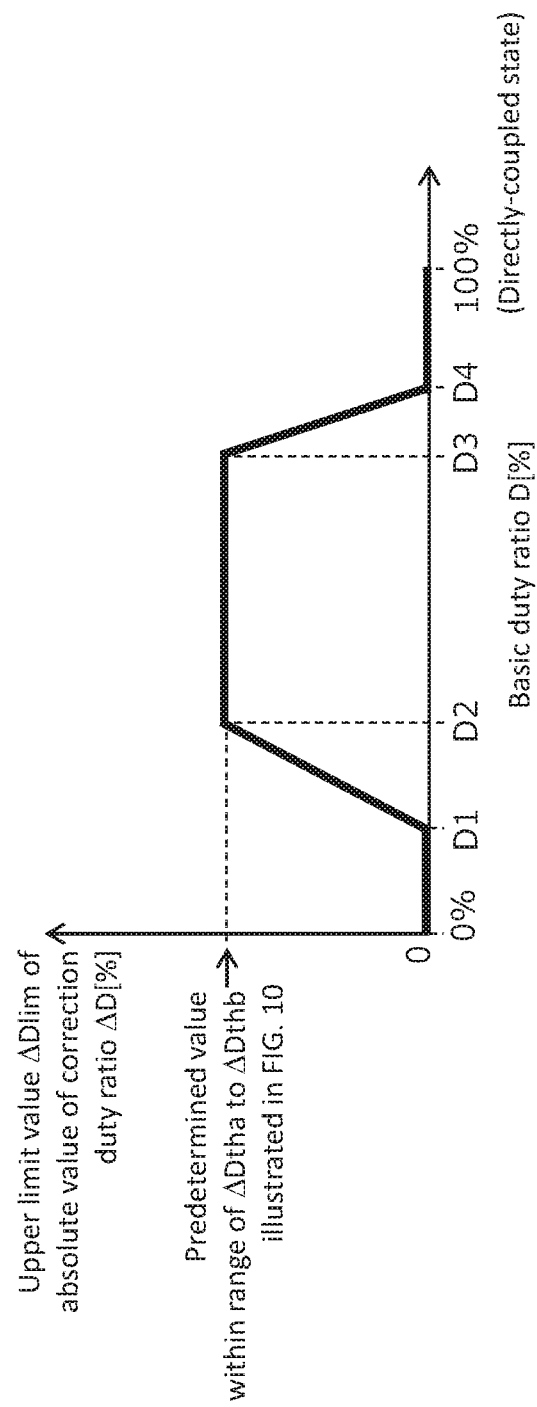
FIG. 13 is a view illustrating a relation, which is set by an upper limit value limiting unit of the third embodiment, between a basic duty ratio and an upper limit value of a correction duty ratio.

The upper limit value ΔDlim of the absolute value of the correction duty ratio ΔD preset in the upper limit value limiting unit 327 is set based on the basic duty ratio D determined by the basic controller 321. FIG. 13 is a view illustrating a relation, which is set by the upper limit value limiting unit 327 of the third embodiment, between the basic duty ratio D and the upper limit value ΔDlim of the absolute value of the correction duty ratio ΔD. Incidentally, in FIG. 13, the values of the basic duty ratio D have a relation of 0<D1<D2<D3<D4<100. When the basic duty ratio D is 0%, at least one of the converters configuring the VCU 111 becomes in a stop state. When the basic duty ratio D is 100%, at least one of the converters configuring the VCU 111 becomes in a directly-coupled state.

Figure 10:
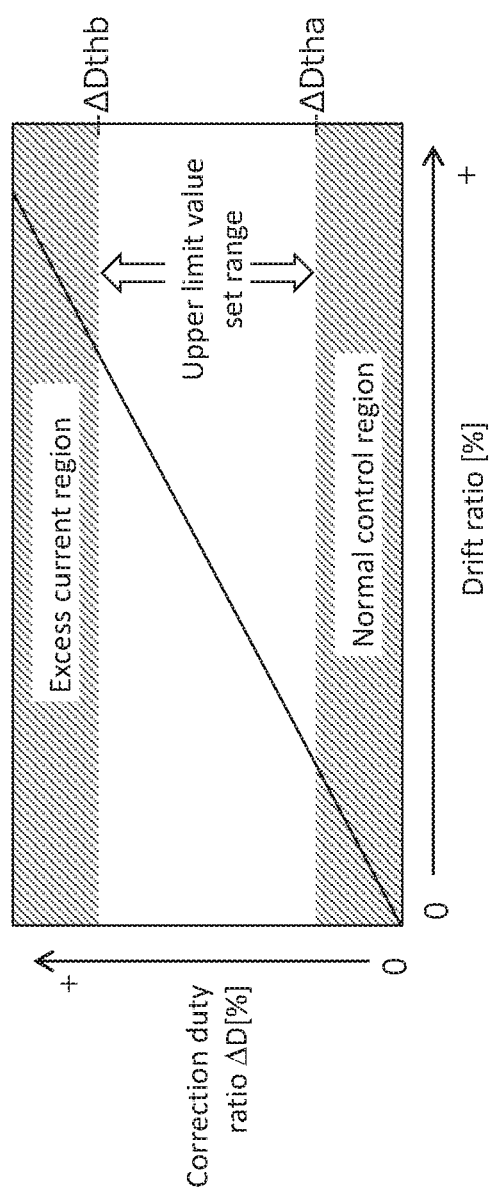
FIG. 10 is a view illustrating a set range of an upper limit value of a correction duty ratio preset in an upper limit value limiting unit.

The upper limit value ΔDlim of the absolute value of the correction duty ratio ΔD is such a maximum value that prevents that the duty ratio of one of the two converters in the VCU 111 becomes 0% (stop state) or 100% (directly-coupled state) due to the correction duty ratio ΔD. As illustrated in FIG. 13, the upper limit value ΔDlim of the absolute value of the correction duty ratio ΔD in this embodiment is set to 0% in a range where of the basic duty ratio D is from 0 to D1(%) and from D4 to 100(%). The upper limit value ΔDlim is set to a value closer to 0% as the basic duty ratio D is smaller in a range where the basic duty ratio D is from D1 to D2(%). The upper limit value ΔDlim is set to a value closer to 0% as the basic duty ratio D is larger in a range where the basic duty ratio D is from D3 to D4(%). The upper limit value ΔDlim is set to a value smaller than the preset basic duty ratio D in a range where the basic duty ratio D is from D2 to D3(%). Incidentally, the upper limit value ΔDlim of the absolute value of the correction duty ratio ΔD set in a range where the basic duty ratio D is D2 to D3(%) is a predetermined value within the upper limit value set range which is described also in the second embodiment and is illustrated in FIG. 10. When the VCU 111 is operated normally, the upper limit value ΔDlim is equal to or more than the maximum value ΔDtha of the correction duty ratio ΔD determined by the equalization controller 325, and when at least one of the phase current sensors included in the VCU 111 is abnormal, the upper limit value ΔDlim is equal to or less than the minimum value ΔDthb of the correction duty ratio ΔD determined by the equalization controller 325. Incidentally, the predetermined value is a value which is closer to the maximum value ΔDtha than the minimum value ΔDthb.

The control signal generation unit 329 generates two types of control signals S1 and S2, that is, the control signal S1 in which the duty ratio is "D+ΔD'" and the control signal S2 in which the duty ratio is "D−ΔD'", based on the basic duty ratio D determined by the basic controller 321 and the correction duty ratio ΔD' output by the upper limit value limiting unit 327. One of two types of control signals S1 and S2 generated by the control signal generation unit 329 is supplied to the switching element of one of the two converters configuring the VCU 111, and the other control signal is supplied to the switching element of the other converter.

Figure 14:
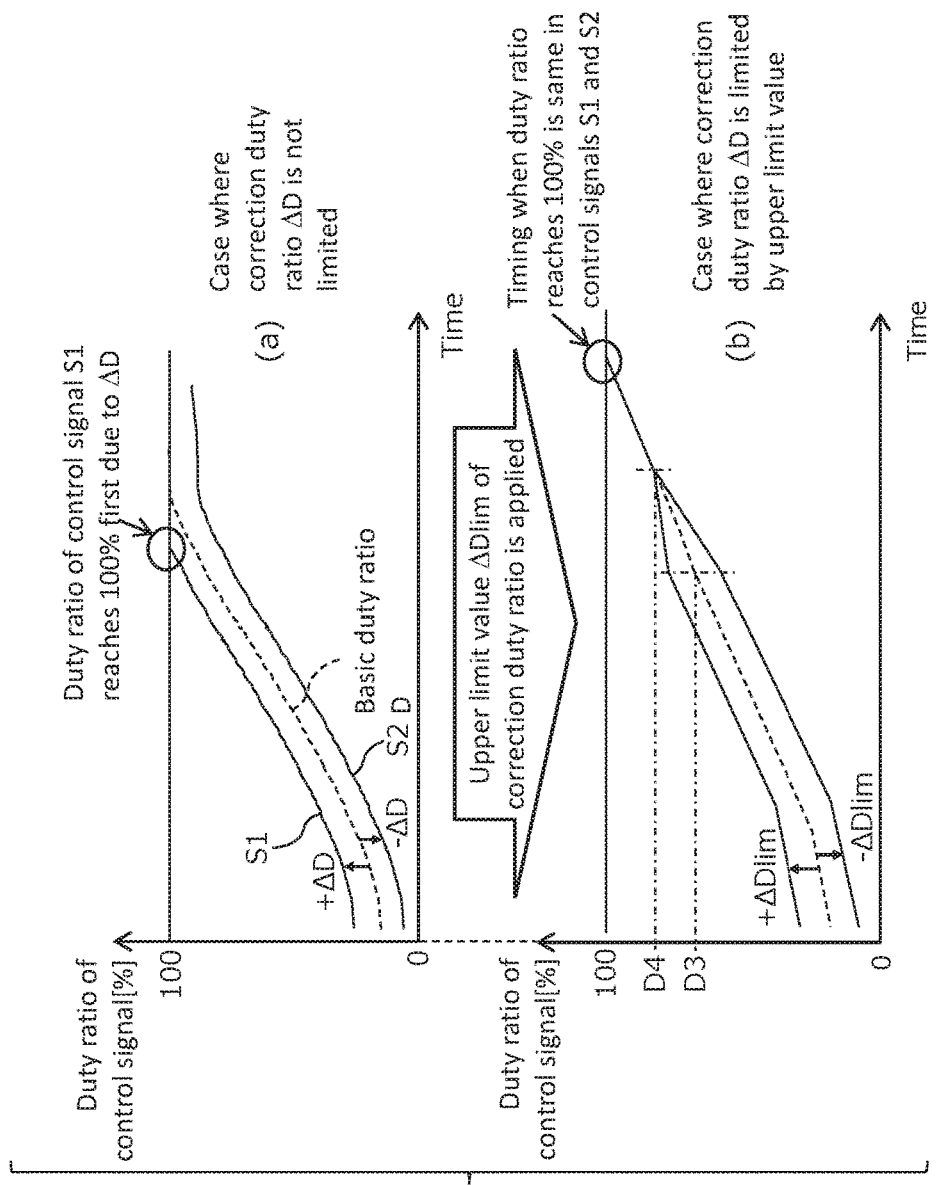
FIG. 14 is a view illustrating (a) one example of time-elapse change of each duty ratio of the control signals in a case where the correction duty ratio is not limited by the upper limit value and (b) one example of time-elapse change of each duty ratio of the control signals in a case where the correction duty ratio in the third embodiment is limited by the upper limit value, in a case where the basic duty ratio approaches 100%.
Figure 15A:
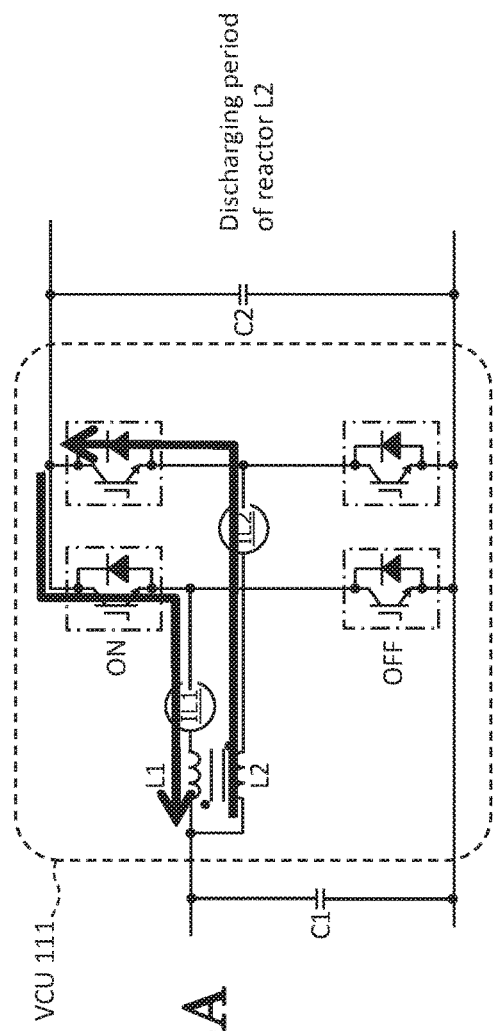
FIG. 15A is a view illustrating a state where a circulating current of a DC component circulating in the VCU is generated.
Figure 15B:
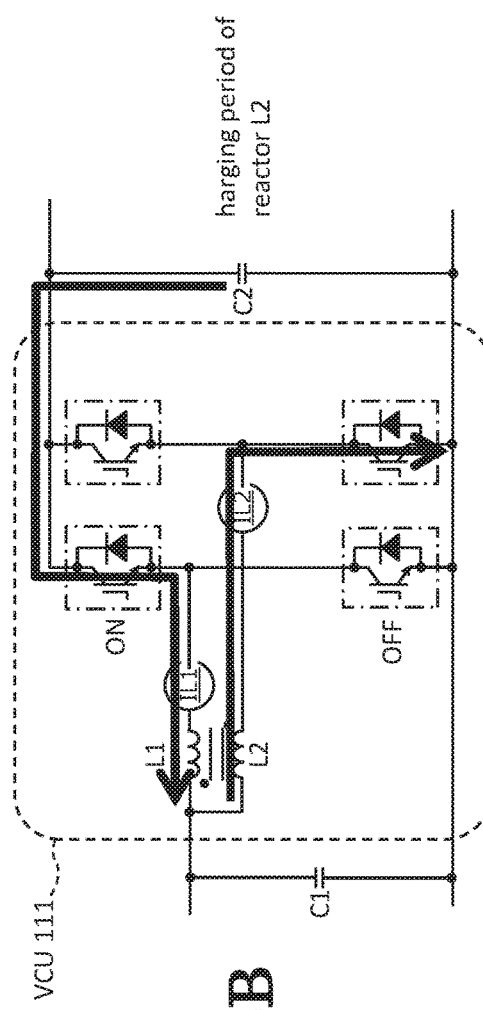
FIG. 15B is a view illustrating a state where energy stored in the smoothing capacitor flows to a VCU side.

FIG. 14 is a view illustrating (a) one example of time-elapse change of each duty ratio of the control signals S1 and S2 in a case where the absolute value of the correction duty ratio ΔD is not limited by the upper limit value ΔDlim and (b) one example of time-elapse change of each duty ratio of the control signals S1 and S2 in a case where the absolute value of the correction duty ratio ΔD in the third embodiment is limited by the upper limit value ΔDlim, in a case where the basic duty ratio D approaches 100%. In (a) of FIG. 14, although the basic duty ratio D becomes close to 100%, the correction duty ratio ΔD is not changed. Thus, the duty ratio "D+ΔD" of the control signal S1 for the correction duty ratio ΔD reaches 100% first. In a state where the duty ratio "D+ΔD" of the control signal S1 reaches 100%, the converter to which the control signal S1 is supplied becomes in the directly-coupled state. When one of the converters configuring the VCU 111 becomes in the directly-coupled state, during the discharging period of the reactor L2 of another converter, as illustrated in FIG. 15A, the circulating current of the DC component circulating in the VCU 111 is generated, and the energy stored in the smoothing capacitor C2 mostly flows to the side of the converter in the directly-coupled state. In addition, during the charging period of the reactor L2, as illustrated in FIG. 15B, the energy stored in the smoothing capacitor C2 flows to the VCU 111 side. As described above, when one of the converters in the VCU 111 becomes in the directly-coupled state so that the energy is not used efficiently, and another converter continues the voltage conversion in the state as it is, there is a risk that the phase current for the control of the basic controller 321 reaches the excess current.

With respect thereto, when the upper limit value ΔDlim of the absolute value of the correction duty ratio in this embodiment is applied, the duty ratios of the control signals S1 and S2 reach 100% at the same time as illustrated in (b) of FIG. 14. The reaching timing is later than a timing when the duty ratio "D+ΔD" of the control signal S1 reaches 100% in (a) of FIG. 14.

Figure 16:
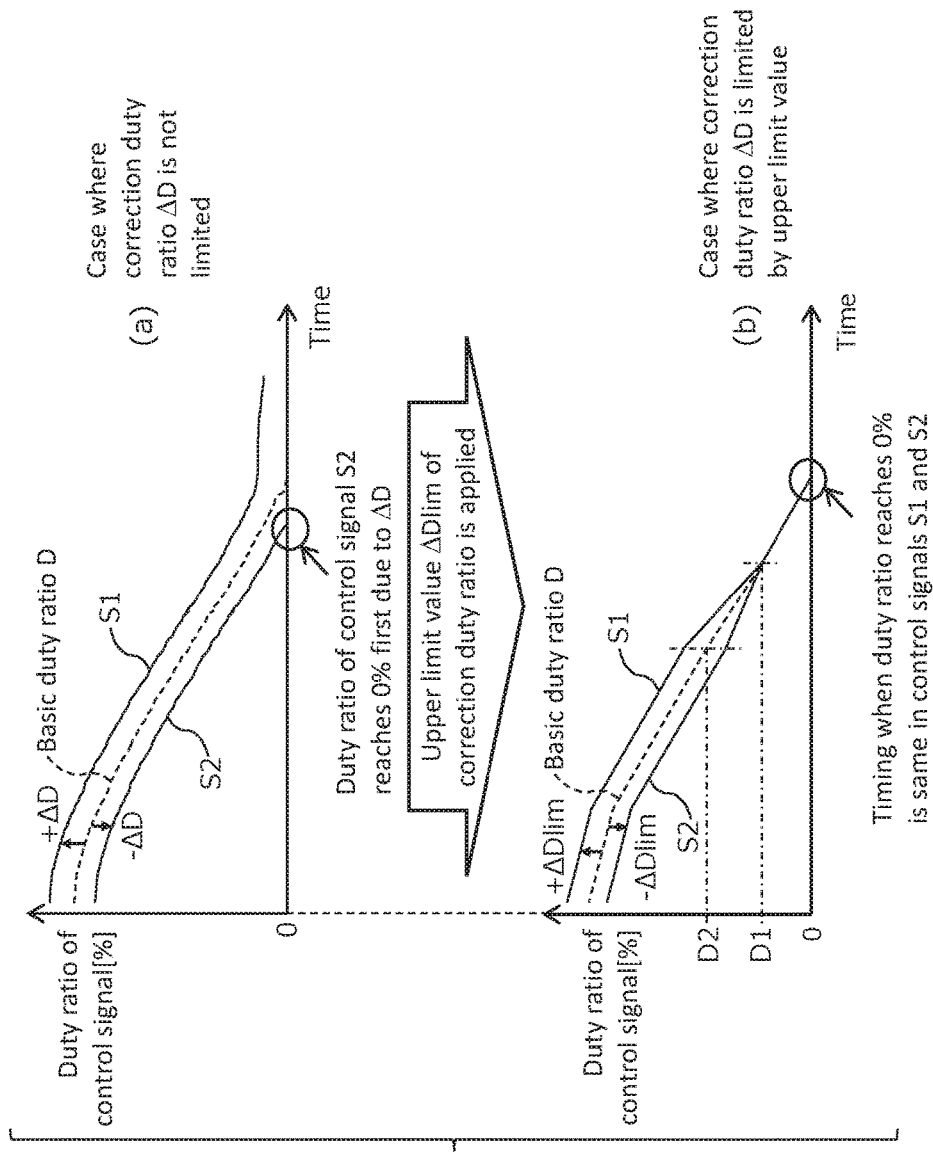
FIG. 16 is a view illustrating (a) one example of time-elapse change of each duty ratio of the control signal in a case where the correction duty ratio is not limited by the upper limit value and (b) one example of time-elapse change of each duty ratio of the control signal in a case where the correction duty ratio in the third embodiment is limited by the upper limit value, in a case where the basic duty ratio approaches 0%.
Figure 17A:
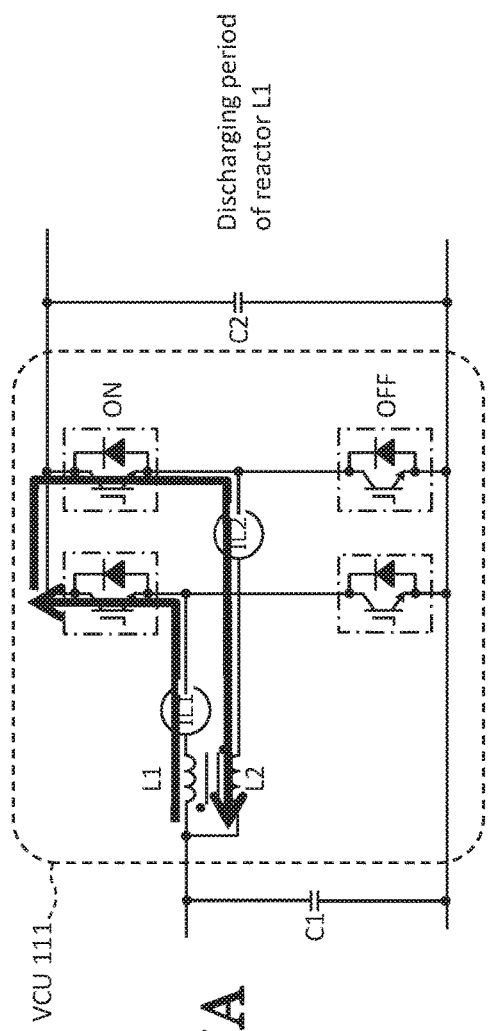
FIG. 17A is a view illustrating a state where the circulating current of the DC component circulating in the VCU is generated.
Figure 17B:
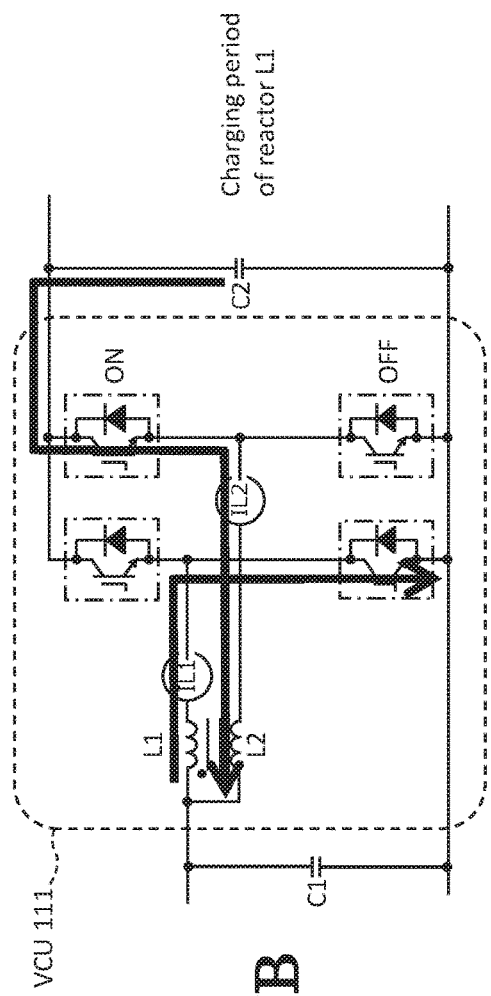
FIG. 17B is a view illustrating a state where the energy stored in the smoothing capacitor flows to the VCU side.

The above description can be applied also to a case where the basic duty ratio D approaches 0%. FIG. 16 is a view illustrating (a) one example of time-elapse change of each duty ratio of the control signals S1 and S2 in a case where the absolute value of the correction duty ratio ΔD is not limited by the upper limit value ΔDlim and (b) one example of time-elapse change of each duty ratio of the control signals S1 and S2 in a case where the absolute value of the correction duty ratio ΔD in the third embodiment is limited by the upper limit value ΔDlim, in a case where the basic duty ratio D approaches 0%. In (a) of FIG. 16, although the basic duty ratio D becomes close to 0%, the correction duty ratio ΔD is not changed. Thus, the duty ratio "D−ΔD" of the control signal S2 for the correction duty ratio ΔD reaches 0% first. In a state where the duty ratio "D−ΔD" of the control signal S2 reaches 0%, the converter to which the control signal S2 is supplied becomes in the stop state. When one of the converters configuring the VCU 111 becomes in the stop state, during the discharging period of the reactor L1 of another converter, as illustrated in FIG. 17A, the circulating current of the DC component circulating in the VCU 111 is generated, and the energy stored in the smoothing capacitor C2 mostly flows to the side of the converter in the stop state. In addition, during the charging period of the reactor L1, as illustrated in FIG. 17B, the energy stored in the smoothing capacitor C2 flows to the VCU 111 side. As described above, when one of the converters in the VCU 111 becomes in the stop state so that the energy is not used efficiently, and another converter continues the voltage conversion in the state as it is, there is a risk that the phase current for the control of the basic controller 321 reaches the excess current.

With respect thereto, when the upper limit value ΔDlim of the absolute value of the correction duty ratio in this embodiment is applied, the duty ratios of the control signals S1 and S2 reach 0% at the same time as illustrated in (b) of FIG. 16. The reaching timing is later than a timing when the duty ratio "D−ΔD" of the control signal S2 reaches 0% in (a) of FIG. 16.

The switching element of the converters configuring the VCU 111 is on/off-controlled with the above-described control signals S1 and S2. Thus, the VCU 111 performs the voltage conversion in consideration of two controls of the control for setting the input or the output as the target value and the control for equalizing the phase currents IL1 and IL2. As a result, the drift current amount indicated as a difference between the phase current IL1 and the phase current IL2 flowing in the converters when the VCU 111 boosts the input voltage V1 to the output voltage V2 is suppressed to the predetermined value or less.

As described above, according to this embodiment, the control signals S1 and S2 which control the respective two converters of the VCU 111 are generated based on the basic duty ratio D and the correction duty ratio ΔD', and the upper limit value ΔDlim of the absolute value of the correction duty ratio ΔD for the balance of the two phase currents is set based on the basic duty ratio D. By setting the upper limit value ΔDlim, the correction duty ratio ΔD' is suppressed to a proper amount with respect to the basic duty ratio D, so that any one of the converters does not become in the stop state or the directly-coupled state, thereby stabilizing the control of the VCU 111. That is, the correction duty ratio ΔD' which is equal to or less than the upper limit value ΔDlim does not affect the stability of the voltage conversion which is the primary function of the VCU 111, thereby reducing the drift current between the two phase currents.

If there is concern that the duty ratio of one of the two converters becomes 100% (directly-coupled state) or 0% (stop state) due to the correction duty ratio ΔD determined by the equalization controller 325, the control signals S1 and S2 are generated only based on the basic duty ratio D. That is, when the basic duty ratio D is 0% or near 0% or 100% or near 100%, the upper limit value ΔDlim of the correction duty ratio is set to 0. Thus, it can be prevented that only one of the two converters becomes in the stop state or the directly-coupled state due to the correction duty ratio.

When the basic duty ratio D is in a range of D1 to D2(%), the upper limit value ΔDlim of the absolute value of the correction duty ratio ΔD is set to the value closer to 0 as the basic duty ratio D is closer to the value D1 which is near 0%. When the basic duty ratio D is in a range of D3 to D4(%), the upper limit value ΔDlim is set to the value closer to 0 as the basic duty ratio D is set closer to the value D4 which is near 100%. Thus, while a control for the balance of the phase current between two phases is performed, it can be prevented that only one of the two converters becomes in the stop state or the directly-coupled state due to the correction duty ratio. In addition, when the basic duty ratio D is in a range of D2 to D3(%), the upper limit value ΔDlim of the absolute value of the correction duty ratio ΔD is set to the predetermined value, and thus the control for the balance of the phase current between the two phases can be performed reliably.

Fourth Embodiment

A different point of an electric vehicle of a fourth embodiment from the electric vehicle of the first embodiment is an inner structure of the ECU, and the other points are the same as those of the first embodiment. For this reason, the description about the same portions or the equivalent portions as the first embodiment other than the ECU is simplified or omitted.

Figure 18:
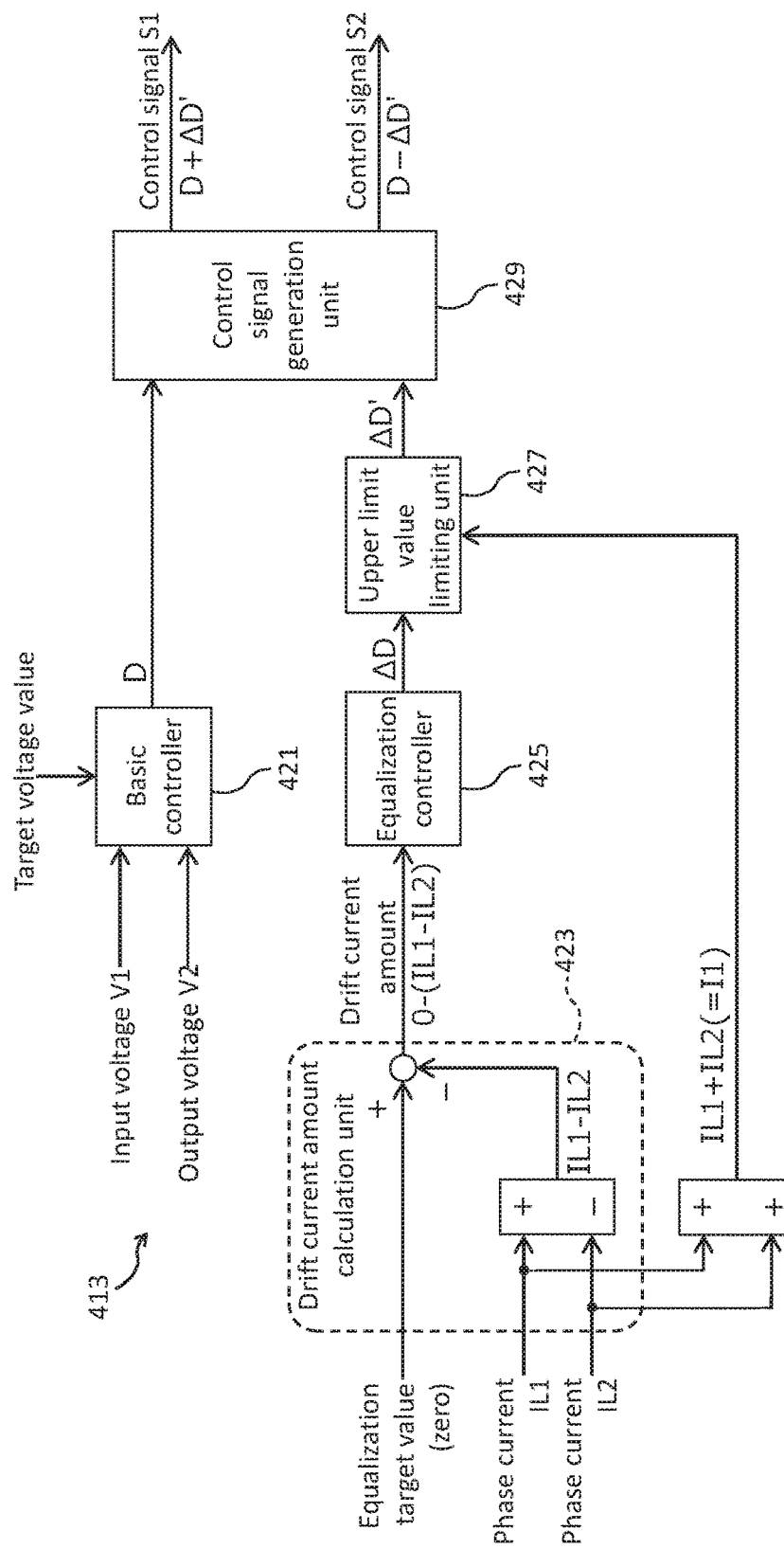
FIG. 18 is a block diagram illustrating an inner structure of an ECU of a fourth embodiment.

FIG. 18 is a block diagram illustrating an inner structure of an ECU 413 of the fourth embodiment. In FIG. 18, the common components to those in FIG. 6 of the first embodiment are denoted by the same reference numerals. As illustrated in FIG. 18, the ECU 413 of the fourth embodiment has a basic controller 421, a drift current amount calculation unit 423, an equalization controller 425, an upper limit value limiting unit 427, and a control signal generation unit 429. Incidentally, the basic controller 421 is a means which takes charge of a control for setting the input or the output of the VCU 111 as the target value. The drift current amount calculation unit 423, the equalization controller 425, and the upper limit value limiting unit 427 are means which take charge of controls for equalizing the phase current flowing in the two converters configuring the VCU 111. The control signal generation unit 429 is a means which generates pulse-shaped control signals corresponding to both of two above-described controls for the different objects.

Hereinafter, the description will be given about the components included in the ECU 413 of the fourth embodiment.

The basic controller 421 determines the basic duty ratio D of the control signal with respect to the switching elements of the converters configuring the VCU 111 for setting the input voltage V1 or the output voltage V2 as the target voltage value, based on the input voltage V1 of the VCU 111 detected by the voltage sensor 1091, the output voltage V2 of the VCU 111 detected by the voltage sensor 1092, and the target voltage value. Incidentally, the basic controller 421 may determines the basic duty ratio D of the control signal with respect to the switching elements of the converters configuring the VCU 111 for setting the input current I1 as the target current valise, based on the input current I1 which is sent to the VCU 111 and detected by the current sensor 107 and the target current value.

The drift current amount calculation unit 423 calculates the difference (IL1−IL2) between the phase current IL1 and the phase current IL2 of the phases of the VCU 111 detected by the respective phase current sensors 1151 and 1152. A difference between the corresponding difference and an equalization target value is calculated as a drift current amount. Incidentally, the equalization target value is 0 (zero) [A] as long as there is not a particular reason that balances one phase current. Therefore, the drift current amount calculation unit 423 calculates "IL2−IL1 (=0−(IL1−IL2))" as the drift current amount.

The equalization controller 425 determines the correction duty ratio ΔD to be added or subtracted to the basic duty ratio D of the control signal for equalizing the phase currents IL1 and IL2, based on the drift current amount which the drift current amount calculation unit 423 calculates. That is, the equalization controller 425 separately determines the correction duty ratio "+ΔD" of the positive value and the correction duty ratio "−ΔD" of the negative value which have the same absolute value.

If the absolute value (|ΔD|) of the correction duty ratio ΔD determined by the equalization controller 425 exceeds the upper limit value ΔDlim preset to the value smaller than the basic duty ratio D, the upper limit value limiting unit 427 outputs a value obtained by performing the upper limit processing on the upper limit value ΔDlim as the correction duty ratio ΔD'. If the absolute value ΔD is the upper limit value ΔDlim or less, the upper limit value limiting unit 427 outputs the correction duty ratio ΔD determined by the equalization controller 425 as it is as the correction duty ratio ΔD'.

The upper limit value ΔDlim of the absolute value of the correction duty ratio ΔD preset by the upper limit value limiting unit 427 is set based on the sum (IL1+IL2) of the phase current IL1 and the phase current IL2 of the phases of the VCU 111 detected by the respective phase current sensors 1151 and 1152, that is, the amplitude of the total currents flowing in the VCU 111. Incidentally, the sum (IL1+IL2) of the phase current IL1 and the phase current IL2 is equal to the input current I1 sent to the VCU 111. For this reason, the upper limit value ΔDlim of the absolute value of the correction duty ratio ΔD may be set based on the amplitude of the input current I1 detected by the current sensor 107 or the target current thereof. In addition, the upper limit value ΔDlim may be set based on the amplitude of the output current of the VCU 111 or the target current thereof.

Figure 19:
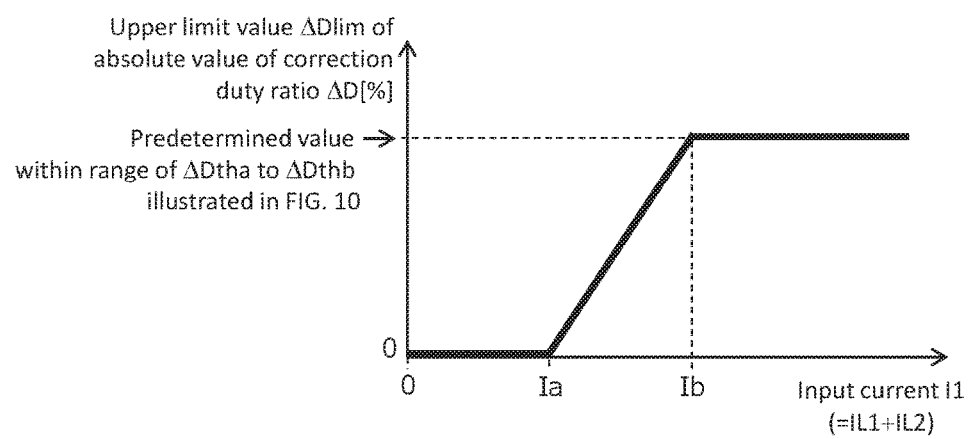
FIG. 19 is a view illustrating a relation, which is set by an upper limit value limiting unit of the fourth embodiment, between a basic duty ratio and an upper limit value of a correction duty ratio.

FIG. 19 is a view illustrating a relation, which is set by the upper limit value limiting unit 427 of the fourth embodiment, between the basic duty ratio D and the upper limit value ΔDlim of the absolute value of the correction duty ratio ΔD. In FIG. 19, the values of the input current I1 have a relation of 0<Ia<Ib. The upper limit value ΔDlim of the absolute value of the correction duty ratio ΔD is such a maximum value that prevents that the duty ratio of one of the two converters in the VCU 111 becomes 0% (stop state) or 100% (directly-coupled state) due to the correction duty ratio ΔD. As illustrated in FIG. 19, the upper limit value ΔDlim of the absolute value of the correction duty ratio ΔD in this embodiment is set to 0% in a range where the input current I1 is from 0 to Ia. The upper limit value ΔDlim is set to a value closer to 0% as the input current I1 is smaller in a range where the input current I1 is from Ia to Ib. The upper limit value ΔDlim is set to a value smaller than the preset basic duty ratio D in a range where the input current I1 is Ib or more. Incidentally, the upper limit value ΔDlim of the absolute value of the correction duty ratio ΔD set in a range where the input current I1 is Ib or more is a predetermined value within the upper limit value set range which is described also in the second embodiment and is illustrated in FIG. 10. When the VCU 111 is operated normally, the upper limit value ΔDlim is equal to or more than the maximum value ΔDtha of the correction duty ratio ΔD determined by the equalization controller 425. When at least one of the phase current sensors included in the VCU 111 is abnormal, the upper limit value ΔDlim is equal to or less than a minimum value ΔDthb of the correction duty ratio ΔD determined by the equalization controller 425. Incidentally, the predetermined value is a value which is closer to the maximum value ΔDtha than the minimum value ΔDthb.

Figure 20:
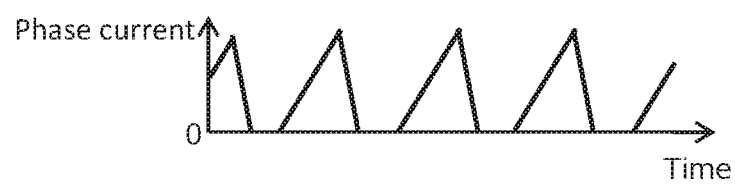
FIG. 20 is a view illustrating one example of the phase current in which a waveform zero-crosses to be discontinuous.

A range (0 to Ia) of the input current I1 in which the upper limit value ΔDlim of the absolute value of the correction duty ratio ΔD is set to 0% is a so-called low current region. When the control for equalizing the phase current in the low current region is performed based on the correction duty ratio ΔD, in at least one of the phase currents flowing in the two converters, the waveform of the currents is discontinuous to zero-cross as illustrated in FIG. 20. Since the converter in which the phase current flows becomes a discontinuous mode, a control stability is impaired. Therefore, in this embodiment, in the low current region where there is a concern that at least one of the converters configuring the VCU 111 becomes in the discontinuous mode, the upper limit value ΔDlim of the absolute value of the correction duty ratio ΔD is set to 0% to perform the control only based on the basic duty ratio D.

As illustrated in FIG. 19, the value Ia which is the maximum value of the input current I1 in the low current region is such a minimum value that prevents that one of the two converters in the VCU 111 becomes in the stop state due to the basic duty ratio D even in consideration of the error included in the detection values of the phase current sensors 1151 and 1152 included in the VCU 111. For example, if the duty ratio corresponding to the error included in the detection values of the phase current sensors 1151 and 1152 is De, the duty ratio corresponding to the error included in the input current I1 is "2De". In this case, the actual input current I1 when the VCU 111 is controlled at the basic duty ratio of the value slightly larger than the duty ratio 2De is set in the input current Ia.

The control signal generation unit 429 generates two types of the control signals S1 and S2, that is, the control signal S1 in which the duty ratio is "D+ΔD'" and the control signal S2 in which the duty ratio is "D−ΔD'" based on the basic duty ratio D determined by the basic controller 421 and the correction duty ratio ΔD' output by the upper limit value limiting unit 427. One of two types of the control signals S1 and S2 generated by the control signal generation unit 429 is supplied to the switching element of one of the two converters configuring the VCU 111, and the other control signal is supplied to the switching element of the other converter.

The switching element of the converters configuring the VCU 111 is on/off-controlled with the above-described control signals S1 and S2. Thus, the VCU 111 performs the voltage conversion in consideration of two controls of the control for setting the input or the output as the target value and the control for equalizing the phase currents IL1 and IL2. As a result, the drift current amount indicated as a difference between the phase current IL1 and the phase current IL2 flowing in the converters when the VCU 111 boosts the input voltage V1 to the output voltage V2 is suppressed to the predetermined value or less.

As described above, in this embodiment, the control signals S1 and S2, which control the two respective converters of the VCU 111 having the phase current sensors 1151 and 1152 having the detection value with the error, are set based on the basic duty ratio D and the correction duty ratio ΔD'. The upper limit value ΔDlim of the absolute value of the correction duty ratio ΔD for the balance of the phase current between the two phases is set based on the sum of the phase currents IL1 and IL2 flowing in the converters, or the amplitude of the input current I1 of the VCU 111 or the target current thereof. By setting the upper limit value ΔDlim, the correction duty ratio ΔD' is suppressed to the proper amount with respect to the amplitude of the current, so that any one of the converters does not become in the stop state, thereby stabilizing the control of the VCU 111 in which the circulating current flows. That is, the correction duty ratio ΔD' which is equal to or less than the upper limit value ΔDlim does not affect the stability of the voltage conversion which is the primary function of the VCU 111, thereby reducing the drift current between the two phase currents.

In the low current region where there is concern that at least one of the two converters becomes in the discontinuous mode due to the correction duty ratio ΔD, the control signals S1 and S2 are generated only based on the basic duty ratio D, thereby stabilizing the control of the VCU 111. That is, the correction duty ratio does not affect the stability of the voltage conversion which is the primary function of the conversion module.

When the sum of the phase current IL1 and the phase current IL2, or the amplitude of the input current I1 sent to the VCU 111 or the target current thereof is small, the upper limit value ΔDlim of the absolute value of the correction duty ratio ΔD is set to 0%. Thus, it can be prevented that a portion of the two converters becomes in the discontinuous mode due to the correction duty ratio ΔD'.

Although there is an unavoidable error in the phase current sensors 1151 and 1152, it is prevented that at least one of the converters becomes in the stop state due to the control based on the basic duty ratio D. Thus, it is possible to secure the stability of the voltage conversion in the VCU 111.

The upper limit value ΔDlim of the absolute value of the correction duty ratio ΔD is set to the value closer to 0 as the upper limit value is closer to the low current region. Thus, while a control for the balance of the phase current between two phases is performed, it can be prevented that a portion of the two converters becomes in the discontinuous mode due to the correction duty ratio ΔD'.

In a region where the sum of the phase current IL1 and the phase current IL2, or the amplitude of the input current I1 sent to the VCU 111 or the target current thereof is sufficiently large, the upper limit value ΔDlim of the absolute value of the correction duty ratio ΔD is set to the predetermined value within the upper limit value set range. Thus, the control for the balance of the phase current between the two phases can be performed reliably.

Incidentally, the present invention is not limited to the above-described embodiment, and may be modified or improved appropriately. For example, the above-described first to fourth embodiments have been described separately, but the electric vehicle may be configured by combining two or more embodiments.

The above-described electric vehicle is a IMOT-type EV (Electrical Vehicle). However, the electric vehicle may be an EV mounted with a plurality of motor generators, or may be a HEV (Hybrid Electrical Vehicle) or a PHEV (Plug-in Hybrid Electrical Vehicle) mounted with the internal combustion engine as well as at least one motor generator. In addition, in the above-described embodiment, the description has been given about an example in which the conversion apparatus according to the present invention is mounted in the electric vehicle. However, the conversion apparatus may be provided in electrical equipment in which transportation is not particularly considered. The conversion apparatus is appropriate for a power source which can output large currents. Particularly, it is preferable that the conversion apparatus is applied to a computer in which a trend of increasing currents is prominent recently.

The VCU 111 in this embodiment is a boosting-type voltage converter which boosts the voltage of the battery 105. However, the VCU 111 may be a step-down type voltage converter which steps down the voltage of the battery 105, or a step-up/down type voltage converter which can steps up/down the voltage in both directions.

DESCRIPTION OF REFERENCE NUMERALS
AND CHARACTERS 101 motor generator
103 PDU
111 VC 105 battery
107 current sensor
1151, 1152 phase current sensor
1091, 1092 voltage sensor
113, 213, 313, 413 ECU
121, 221, 321, 421 basic controller
123, 223, 323, 423 drift current amount calculation unit
125, 225, 325, 425 equalization controller
127, 229, 329, 429 control signal generation unit
227, 327, 427 upper limit value limiting unit
C1, C2 smoothing capacitor
L1, L2 reactor
Co iron core

The invention claimed is:

1. A conversion apparatus, comprising:
a conversion module which has a plurality of phases, each of which has a converter configured to perform a voltage conversion of an electric power discharged from or charged in a power source and a sensor detecting a current value of a phase current flowing in the converter, and in which the plurality of phases are electrically connected in parallel; and
a controller which controls each of a plurality of the converters with a control signal generated based on a predetermined duty ratio,
wherein the controller includes
a first determination unit which determines a basic duty ratio common to all of the plurality of phases, such that the conversion module inputs or outputs a target voltage or a target current,
a second determination unit which determines a correction duty ratio for correcting the basic duty ratio at each of the plurality of converters, and
a generation unit which generates a control signal based on the basic duty ratio and the correction duty ratio,
wherein the second determination unit determines the correction duty ratio based on a difference between a plurality of phase currents flowing in the plurality of converters respectively, and
the second determination unit sets an upper limit value or a lower limit value of the correction duty ratio based on an amplitude of total currents flowing in the conversion module or the target current.

2. The conversion apparatus according to claim 1, wherein the second determination unit sets the upper limit value or the lower limit value to 0 in a case where the amplitude of the total currents or the target current is less than a first threshold value.

3. The conversion apparatus according to claim 2, wherein the first threshold value is a minimum value that prevents at least one of the plurality of converters from becoming a stop state due to the basic duty ratio.

4. The conversion apparatus according to claim 2, wherein the second determination unit sets the upper limit value or the lower limit value to a value which is closer to 0 as the amplitude of the total currents or the target current is closer to the first threshold value, in a case where the amplitude of the total currents or the target current is equal to or more than the first threshold value and is less than a second threshold value which is larger than the first threshold value.

5. The conversion apparatus according to claim 4, wherein the second determination unit sets the upper limit value or the lower limit value to a predetermined value in a case where the amplitude of the total currents or the target current is equal to or more than the second threshold value.

6. An equipment comprising: a battery; and the conversion apparatus of claim 1, wherein the conversion apparatus is coupled to the battery, which serves as the power source.

7. A conversion apparatus, comprising:
a conversion module which has a plurality of phases, each of which has a converter configured to perform a voltage conversion of an electric power discharged from or charged in a power source and a sensor detecting a current value of a phase current flowing in the converter, and in which the plurality of phases are electrically connected in parallel; and
a controller which controls each of a plurality of the converters with a control signal generated based on a predetermined duty ratio,
wherein the controller includes
a first determination unit which determines a basic duty ratio common to all of the plurality of phases, such that the conversion module inputs or outputs a target voltage or a target current,
a second determination unit which determines respective correction duty ratios with respect to the plurality of converters based on a difference between a plurality of phase currents flowing in the plurality of converters respectively, and
a generation unit which generates the control signal based only on the basic duty ratio, in a case where at least one of the plurality of converters becomes in a discontinuous mode when the conversion module is controlled with the control signal based on the basic duty ratio and the correction duty ratio.

8. A control method of a conversion apparatus including a conversion module which has a plurality of phases, each of which has a converter configured to perform a voltage conversion of an electric power discharged from or charged in a power source and a sensor detecting a current value of a phase current flowing in the converter, and in which the plurality of phases are electrically connected in parallel, and
a controller which controls each of a plurality of the converters with a control signal generated based on a predetermined duty ratio,
the method comprises the steps of:
determining a basic duty ratio common to all of the plurality of phases, such that the conversion module inputs or outputs a target voltage or a target current;
setting an upper limit value or a lower limit value of a correction duty ratio for correcting the basic duty ratio based on an amplitude of total currents flowing in the conversion module or the target current;
determining the correction duty ratio at each of the plurality of converters based on a difference between a plurality of phase currents flowing in the plurality of converter respectively; and
generating a control signal based on the basic duty ratio and the correction duty ratio.

9. A control method of a conversion apparatus including a conversion module which has a plurality of phases, each of which has a converter configured to perform a voltage conversion of an electric power discharged from or charged in a power source and a sensor detecting a current value of a phase current flowing in the converter, and in which the plurality of phases are electrically connected in parallel, and
a controller which controls each of a plurality of the converters with a control signal generated based on a predetermined duty ratio, the method comprises the steps of:

determining a basic duty ratio common to all of the plurality of phases, such that the conversion module inputs or outputs a target voltage or a target current;

determining respective correction duty ratios with respect to the plurality of converters based on a difference between a plurality of phase currents flowing in the plurality of converters respectively; and generating the control signal based only on the basic duty ratio, in a case where at least one of the plurality of converters becomes in a discontinuous mode when the conversion module is controlled with the control signal based on the basic duty ratio and the correction duty ratio.

* * * * *